(12) United States Patent
Higashikawa

(10) Patent No.: US 6,252,158 B1
(45) Date of Patent: *Jun. 26, 2001

(54) PHOTOVOLTAIC ELEMENT AND SOLAR CELL MODULE

(75) Inventor: Makoto Higashikawa, Kyotanabe (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 35 days.

(21) Appl. No.: 09/333,002

(22) Filed: Jun. 15, 1999

(30) Foreign Application Priority Data

Jun. 16, 1998 (JP) ................................. 10-167926

(51) Int. Cl.$^7$ ..................................... H01L 31/00
(52) U.S. Cl. .......................................... 136/258
(58) Field of Search ............................. 136/258

(56) References Cited

U.S. PATENT DOCUMENTS

| 5,103,284 | * | 4/1992 | Ovshinsky et al. | ............ | 136/258 |
| 5,720,827 |   | 2/1998 | Simmons | ..................... | 136/250 |

FOREIGN PATENT DOCUMENTS 7-384453  2/1995  (JP).
8-172208  7/1996  (JP).

OTHER PUBLICATIONS

R. Flückiger, et al., "Preparation of Undoped and Doped Microcrystalline Silicon ($\mu$c–Si:H) by VHF–GD for P–I–N Solar Cells", 23rd IEEE Photovoltaic Spec. Conf., pp. 839–844 (1993).

* cited by examiner

Primary Examiner—Mark Chapman
(74) Attorney, Agent, or Firm—Fitzpatrick, Cella, Harper & Scinto

(57) ABSTRACT

A photovoltaic element has a first conduction type semiconductor layer 103 of the n$^+$-type or the p$^+$-type, an intrinsic semiconductor layer 108 of the i-type, and a second conduction type semiconductor layer 105 of the p$^+$-type or the n$^+$-type successively stacked on a substrate 101. When a unit 107 is defined as a set of a first microcrystal silicon base semiconductor layer 103 and a second microcrystal silicon base semiconductor layer 104 of mutually different absorption coefficients at 800 nm, the i-type layer 108 includes at least two such units. This makes it possible to provide the photovoltaic element that can absorb the light efficiently with avoiding the light degradation phenomenon (Staebler-Wronski effect) specific to amorphous semiconductors and that has good electric characteristics (mobility $\mu$, lifetime $\tau$) and the like.

18 Claims, 7 Drawing Sheets

PHOTOVOLTAIC ELEMENT AND SOLAR CELL MODULE

BACKGROUND OF THE INVENTION

1. Field of the Invention

The present invention relates to a photovoltaic element having microcrystal semiconductor layers of different light absorption coefficients as an i-type layer of pin type semiconductor layers, and a solar cell module comprised of a plurality of such connected photovoltaic elements.

2. Related Background Art

The photovoltaic elements for converting light to electric energy are commonly applied as solar cells to power supplies for small power in consumer-oriented products, such as desk-top calculators, watches, etc., and are drawing attention as to practical use thereof as future alternate power of the so-called fossil fuels, such as petroleum, coal, and so on. Further, they are also used as sensors in facsimile machines, scanners, and so on.

The photovoltaic elements are elements utilizing the photoelectromotive force (photovoltage) of the pn junction, the Schottky junction, or semiconductors, in which the semiconductor of silicon, or the like absorbs the light to generate photocarriers such as electrons and holes, and the photocarriers drift outside due to an internal electric field of the pn junction part.

The most commonly photovoltaic elements heretofore used single-crystal silicon as a material. Most of such photovoltaic elements are produced by a semiconductor process. Specifically, a single crystal of silicon valency-controlled in the p-type or in the n-type, is prepared by a crystal growth method, such as the CZ method or the like, and the single crystal is sliced into silicon wafers to achieve the thickness of about 300 $\mu$m. Further, the pn junction is made by forming layers of different conduction types by appropriate means, such as diffusion of a valency controller to make the conduction type opposite to that of the wafer.

Incidentally, the photovoltaic elements using such single-crystal silicon are increasing their production cost, because the production cost of silicon wafer is high, and photovoltaic elements made using the semiconductor process are expensive. Therefore, the production cost per unit generated power becomes higher than by the existing power generation methods, and that it is considered that it is difficult to decrease to an applicable level for power.

To development practical use of the photovoltaic elements for power, it is thus realized that important technological challenges are to decrease cost and increase area. A search has been conducted for materials and low cost materials, materials with high conversion efficiency, and so on.

Such materials for photovoltaic elements include tetrahedrally bonded amorphous semiconductors, such as amorphous silicon, amorphous silicon germanium, amorphous silicon carbide, and so on, polycrystal semiconductors, compound semiconductors of II–VI group such as CdS, $Cu_2S$, or the like, and III–V group such as GaAs, GaAlAs, or the like, and so on. Among others, the thin film photovoltaic elements using the amorphous semiconductors or the polycrystal semiconductors for the photovoltage generating layers are considered to be promising because of the advantage of obtaining a larger-area film, while the thickness of film is reduced, compared to the photovoltaic elements using the single-crystal silicon, and the film can be deposited on an arbitrary support substrate material, and so on.

The above thin film photovoltaic elements, however, have not yet reached the photovoltaic efficiency (photoelectric conversion efficiency) comparable to those of the photovoltaic elements using the single-crystal silicon and, therefore, improvements in the photovoltaic efficiency and in reliability were points to be studied in order to realize the practical use thereof as elements for power.

Recently, A. Shah et al., 23th IEEE Photovoltaic Specialist Conf. (1993) p839, disclosed the technology of solar cells using microcrystalline silicon for the carrier generating layer. It is reported that such solar cells do not suffer the optical degradation phenomenon (Staebler-Wronski effect) specific to the amorphous semiconductors.

On the other hand, Japanese Laid-open Patent Application No. 8-172208 discloses lamination of amorphous semiconductor and single crystals of the crystalline structure, or axially oriented polycrystals, as semiconductor devices of the superlattice structure, in which a plurality of semiconductor substances of different kinds are alternately stacked each in the thickness of about several ten Å.

Further, Japanese Patent Publication No. 7-38453 discloses repetitive lamination of microcrystal silicon and amorphous silicon.

The conversion efficiencies of the solar cells reported in A. Shah et al., 23th IEEE Photovoltaic Specialist Conf. (1993) p839 are lower than those of the crystalline silicon solar cells. It is also reported that deposition rates are low.

In general, microcrystal silicon films are made using RF glow discharge, but light absorption of such microcrystal silicon films is low, because they have indirect optical edges, similar to the crystalline silicons. Therefore, the thickness of film needs to be approximately 5 $\mu$m, and a great deal of time is necessary for production.

In the above technology of A. Shah et al., 23th IEEE Photovoltaic Specialist Conf. (1993) p839, though the frequency of 70 MHz is used, the film thickness is up to 3 $\mu$m and depositing rates are approximately 1 Å/sec; therefore, the deposition of film still requires a long time.

The techniques disclosed in Japanese Laid-Open Patent Application No. 8-172208 and Japanese Patent Publication No. 7-38453 are the lamination of amorphous semiconductor and single crystal or polycrystals, or microcrystals, and, because either of them uses the amorphous semiconductor, the optical degradation phenomenon (Staebler-Wronski effect) specific to the amorphous semiconductors cannot be avoided.

SUMMARY OF THE INVENTION

An object of the present invention is, therefore, to provide a photovoltaic element that can absorb light efficiently and has good electric characteristics (mobility $\mu$, lifetime $\tau$) etc., while avoiding the optical degradation phenomenon (Staebler-Wronski effect) specific to the amorphous semiconductors, and also provide a solar cell module using the photovoltaic element.

In order to accomplish the above object, a photovoltaic element of the present invention comprises a first conduction type semiconductor layer of the n-type or the p-type, an intrinsic semiconductor layer (i-type layer), a second conduction type semiconductor layer of the p-type or the n-type successively stacked on a substrate, wherein when one unit is defined as a set of a first microcrystal silicon base semiconductor layer and a second microcrystal silicon base semiconductor layer of mutually different absorption coefficients at 800 nm, the i-type layer comprises at least two said units.

Here, it is preferable that the first microcrystal silicon base semiconductor layer and the second microcrystal silicon base semiconductor layer be of a columnar crystal structure.

Further, it is preferable that an average grain size of the first microcrystal silicon base semiconductor layer be different from that of the second microcrystal silicon base semiconductor layer.

More preferably, the average grain sizes of the first microcrystal silicon base semiconductor layer and the second microcrystal silicon base semiconductor layer are in the range of 3 nm to 200 nm.

It is also preferable that a crystal volume percentage of the first microcrystal silicon base semiconductor layer be different from that of the second microcrystal silicon base semiconductor layer.

More preferably, the crystal volume percentages of the first microcrystal silicon base semiconductor layer and the second microcrystal silicon base semiconductor layer are in the range of 30% to 99%.

Further, it is preferable that the hydrogen content of the first microcrystal silicon base semiconductor layer be different from that of the second microcrystal silicon base semiconductor layer.

More preferably, the hydrogen contents of the first microcrystal silicon base semiconductor layer and the second microcrystal silicon base semiconductor layer are in the range of 1 atom % to 40 atom %.

It is preferable that the above first conduction type semiconductor layer contain at least one layer of a microcrystal silicon base semiconductor.

It is preferable that the above second conduction type semiconductor layer contain at least one layer of a microcrystal silicon base semiconductor.

It is also preferable that the first conduction type semiconductor layer be a stack of an amorphous silicon base semiconductor layer and at least one layer of a microcrystal silicon base semiconductor.

Further, it is preferable that the second conduction type semiconductor layer be a stack of an amorphous silicon base semiconductor layer and at least one layer of a microcrystal silicon base semiconductor.

It is preferable that the photovoltaic element has an i-type amorphous silicon base semiconductor layer between the i-type layer and the p-type layer.

More preferably, the thickness of the amorphous silicon base semiconductor layer is in the range of 5 nm to 30 nm.

Further preferably, the thickness of the amorphous silicon base semiconductor layer is in the range of 10 nm to 20 nm.

It is also preferable that either one pin photoelectric conversion element of these be stacked together with a pin photoelectric conversion element having an amorphous silicon base semiconductor as an i-type layer.

On the other hand, a solar cell module of the present invention is one obtained by forming either one of the above photovoltaic elements as a roof material.

Another solar cell module of the present invention is one obtained by connecting either one of these photovoltaic elements with power conversion means.

DETAILED DESCRIPTION OF THE PREFERRED EMBODIMENTS

As described above, the present invention concerns the novel photovoltaic element and the solar cell module. The constitution and operation of the invention each will be described below.

1) In the photovoltaic element of the present invention, when one unit is defined as a set of the first microcrystal silicon base semiconductor layer and the second microcrystal silicon base semiconductor layer of mutually different absorption coefficients at 800 nm, the i-type semiconductor layer has at least two said units.

The microcrystal semiconductors, in their structure, are considered to be composed of crystal portions having grain sizes of several ten to several hundred Å, and disordered portions, and the peripheral portions of grains and the disordered portions contain hydrogen or halogen, or the like. From a microscopic aspect, since the grain sizes of the grain portions are several ten to several hundred Å, the quantum size effect appears (the crystal sizes become close to the spread of the wave function of an electron and the effect of the outside of grains becomes prominent) and the percentage of grain boundaries to the inside of crystals increases with decreasing size; therefore, the influence of elements modifying the grain boundaries (in this case, the elements are mainly hydrogen or halogen) is increased.

Figure 3:
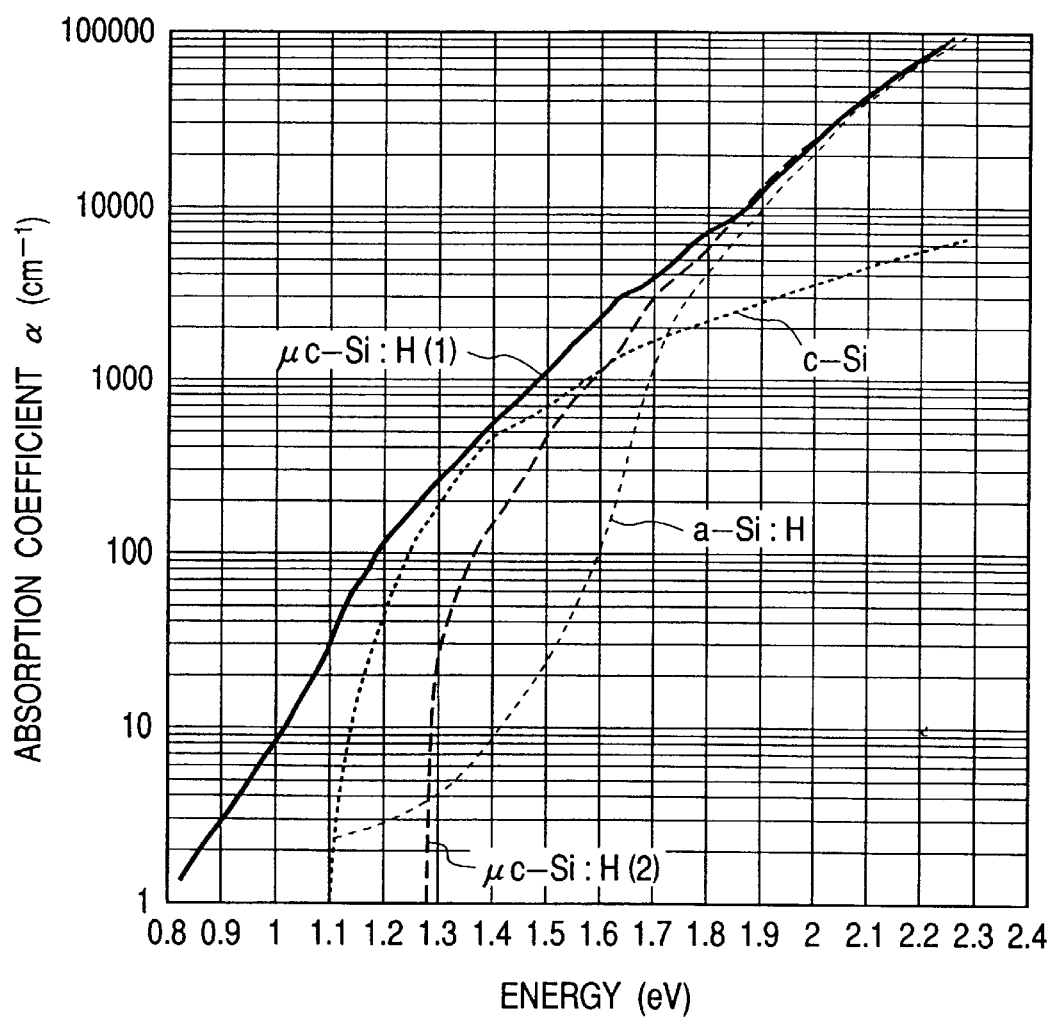
FIG. 3 is an explanatory diagram to show light energy dependence of absorption coefficient of semiconductor layers.

FIG. 3 shows the light energy dependence of absorption coefficient. FIG. 3 shows the light energy dependence of absorption coefficient of an ordinary amorphous silicon semiconductor (a-Si:H), an ordinary single-crystal silicon semiconductor (c-Si), and two types of microcrystal silicon semiconductors ($\mu$c-Si:H), prepared by different production methods. Since the single-crystal silicon semiconductor is an indirect gap semiconductor with the bandgap of 1.1 eV, absorption rises near 1.1 eV and is gentle. On the other hand, in the case of the amorphous silicon semiconductor, absorption occurs because of structural disorder at the bandgap of about 1.7 eV without intervention of phonon and thus the absorption coefficient thereof is large.

Here, the microcrystal silicon semiconductors include the crystal portions and the disordered portions, and are also affected by the elements modifying the grain boundaries. Thus, they have different absorption coefficients because of the difference in internal structure. Both $\mu$c-Si:H (1) and $\mu$c-Si:H (2), shown in FIG. 3, are the microcrystal silicon semiconductors, which were made by different production methods, and, thus, their light energy dependences of the absorption coefficient are different from each other, reflecting the difference in internal structure. In this way, the microcrystal silicon semiconductors can have variations in the light energy dependence of absorption coefficient.

The electrical characteristics of the microcrystal silicon semiconductors vary largely depending upon an existence ratio of the crystal portions to the disordered portions and the extent of modification by hydrogen on the grain boundaries, though also differing due to the degree of occurrence of defects in the crystal portions and disordered portions themselves.

On the other hand, by stacking of the microcrystal silicon base semiconductor layers of different absorption coefficients, due to the difference in the composition of alloys mainly containing silicon, or due to the difference in the structure of microcrystals, light sensitivity can be assured in the short to long wave range while maintaining good electrical characteristics. Further, optimum adjustment can be achieved by properly adjusting the combination of absorption coefficients of the microcrystal silicon base semiconductor layers and thickness thereof. As a result, the photovoltaic element with high efficiency can be provided with little light degradation.

Since in the photovoltaic element of the present invention the layer for generating photocarriers (the i-type semiconductor layer) is made of the microcrystal semiconductors, the photovoltaic element can be subjected to bending, which was impossible with those of polycrystals heretofore. Further, the structure of the present invention can increase the photoelectric conversion efficiency, when compared at the same thickness, and stress is unlikely to appear because of the multilayered structure. Therefore, the structure of the present invention is resistant to bending. Also, the structure of the present invention can be made thinner without decreasing of efficiency, stress is less likely to appear, and it is more resistant to bending, compared with the conventional structure of a single i-type layer.

2) In the present invention, preferably, the first microcrystal silicon base semiconductor layer and the second microcrystal silicon base semiconductor layer composing the i-type layer are of the columnar crystal structure. This decreases the grain boundaries in the transit direction of carriers and, thus, achieves better characteristics.

3) In the present invention, preferably, the average grain sizes of the first microcrystal silicon base semiconductor layer and the second microcrystal silicon base semiconductor layer forming the i-type layer are different.

Microscopically, since the grain sizes of the grain portions are several ten to several hundred Å, the quantum size effect appears (the crystal sizes become close to the spread of the wave function of electron and the influence of the outside of grains becomes prominent) and the percentage of grain boundaries to the inside of crystals increases with decreasing size; therefore, the elements modifying the grain boundaries (in this case, the elements are mainly hydrogen or halogen) increase their influence.

When the two layers are both microcrystal silicon base semiconductors, it is considered, from an optical aspect, that they become close to the amorphous silicon base semiconductors of the direct transition type, and their absorption coefficients become larger than those of the crystal silicon base semiconductors of the indirect transition type. Because of the difference in the average grain sizes, there appears to be differences in the absorption coefficients and their band profiles are also different.

The band structure of microcrystals in the K space cannot be described accurately, unlike that of the single crystals, but it is considered from the microscopic aspect that the microcrystals have the band structure of the crystal portions and disordered portions affected by the quantum size effect and the peripheral part. The majority of carriers generated in the microcrystal silicon base semiconductors are distributed mainly in low energy portions in the crystal part (in view of electrons or holes). Since this part is crystal, its mobility $\mu$ and lifetime $\tau$ are greater than those of amorphous part and the average grain size affects the electric characteristics. Therefore, the photovoltaic element with higher efficiency can be obtained by combining the layers of different average grain sizes.

The average grain sizes of the first microcrystal silicon base semiconductor layer and the second microcrystal silicon base semiconductor layer are preferably in the range of 3 nm to 200 nm.

4) In the present invention, preferably, the crystal volume percentage of the first microcrystal silicon base semiconductor layer is different from that of the second microcrystal silicon base semiconductor layer.

The disordered portions increase with decreasing crystal volume percentage, so as to broaden the apparent bandgap. In application to the solar cell, the open voltage becomes higher. On the other hand, in the case of films with small crystal volume percentage, the light degradation phenomenon is observed, though the degree is less than in the amorphous silicon base semiconductor films. Therefore, the photovoltaic element with high open voltage can be obtained with little light observed degradation, by combining a film having a large crystal volume percentage with a small crystal volume percentage film.

The crystal volume percentages of the first microcrystal silicon base semiconductor layer and the second microcrystal silicon base semiconductor layer are preferably in the range of 30% to 99%.

5) In the present invention, preferably, the hydrogen content of the first microcrystal silicon base semiconductor layer forming the i-type layer is different from that of the second microcrystal silicon base semiconductor.

The difference of the hydrogen contents results in difference in stress of films and the stack of the films of the different hydrogen contents can relax the stress as a whole and, in turn, can prevent delamination, or the like, even if the films are thick.

The hydrogen contents of the first microcrystal silicon base semiconductor layer and the second microcrystal silicon base semiconductor layer are preferably in the range of 1 atom % to 40 atom %.

6) In the present invention, preferably, the first conduction type semiconductor layer has at least one layer of a microcrystal silicon base semiconductor layer.

This makes it easier to provide the layer with a plurality of properties. If the electric conductivity is attempted to increase by increasing the doping amount, the average grain size and crystal volume percentage will be lowered in general, and the average grain size and crystal volume percentage of the i-type layer deposited thereon will be decreased. Therefore, the photovoltaic element with high efficiency can be produced by combining a conduction type semiconductor layer having a high electric conductivity with a conduction type semiconductor layer having a high grain size and a crystal volume percentage.

7) In the present invention, preferably, the second conduction type semiconductor layer has at least one layer of a microcrystal silicon base semiconductor layer. This makes it easier to provide the layer with a plurality of properties. The photovoltaic element with large open voltage and with capability of taking out short-circuit photocurrent can be obtained by combining a microcrystal semiconductor layer that has a high electric conductivity and a small crystal volume percentage, with a microcrystal semiconductor layer with a small absorption coefficient (i.e., high transmittance).

8) In the present invention, preferably, the first conduction type semiconductor layer is comprised of an amorphous silicon base semiconductor layer and at least one layer of a microcrystal silicon base semiconductor stacked in order.

When the amorphous silicon base semiconductor is used at the interface to the substrate as a base, interface states are decreased, when compared with the microcrystal silicon base semiconductor, and the photovoltaic element can achieve a higher efficiency.

9) In the present invention, preferably, the second conduction type semiconductor layer is comprised of an amorphous silicon base semiconductor layer and at least one layer of a microcrystal silicon base semiconductor stacked in order.

When the amorphous silicon base semiconductor layer is used at the interface to the i-type layer, the issue of misfit at the interface can be relieved, and the open voltage becomes larger because of the large bandgap of the amorphous silicon base semiconductor. Therefore, the photovoltaic element can achieve a higher efficiency.

10) In the present invention, preferably, the photovoltaic element has the i-type amorphous silicon base semiconductor layer between the i-type layer and the p-type layer. When the amorphous silicon base semiconductor layer is interposed between the i-type layer and the p-type layer, the open voltage can be increased and the photovoltaic element can achieve a higher conversion efficiency.

The thickness of this i-type amorphous silicon base semiconductor layer is preferably in the range of 5 nm to 30 nm. Further, the thickness is more preferably in the range of 10 nm to 20 nm.

11) By stacking the pin type photovoltaic element of the present invention and the pin type photovoltaic element using the amorphous silicon base semiconductor for the i-type layer, the photoelectric conversion element obtained can have less optical degradation, higher conversion efficiency, longer stability, and better workability than the conventional devices.

12) The solar cell module of the present invention is one obtained by forming the above photovoltaic element of the present invention as a roof material. This configuration permits production of the roof material incorporating the photovoltaic element with high conversion efficiency and capability of being bent, permitting construction of variously designed roots.

13) Another solar cell module of the present invention is obtained by connecting the above photovoltaic element of the present invention to the power conversion means. This configuration permits relatively free connection of the photovoltaic elements with high conversion efficiency and easy formation of the solar cell module for the power generation system and the like.

An embodiment of the photovoltaic element of the present invention will be described in detail with reference to the accompanying drawings, but it is noted that the present invention is by no means intended to be limited to the embodiment.

Figure 1:
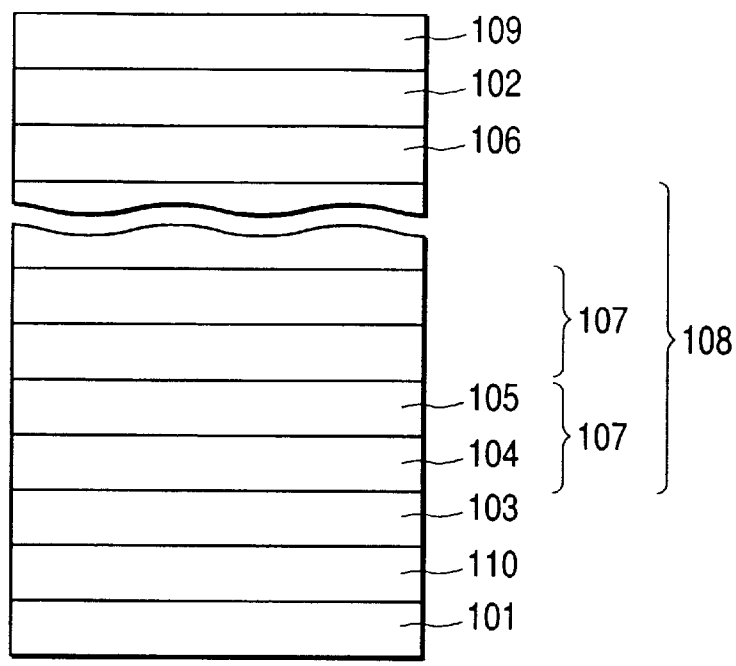
FIG. 1 is a schematic, sectional view to show a first embodiment of the photovoltaic element of the present invention.
Figure 2:
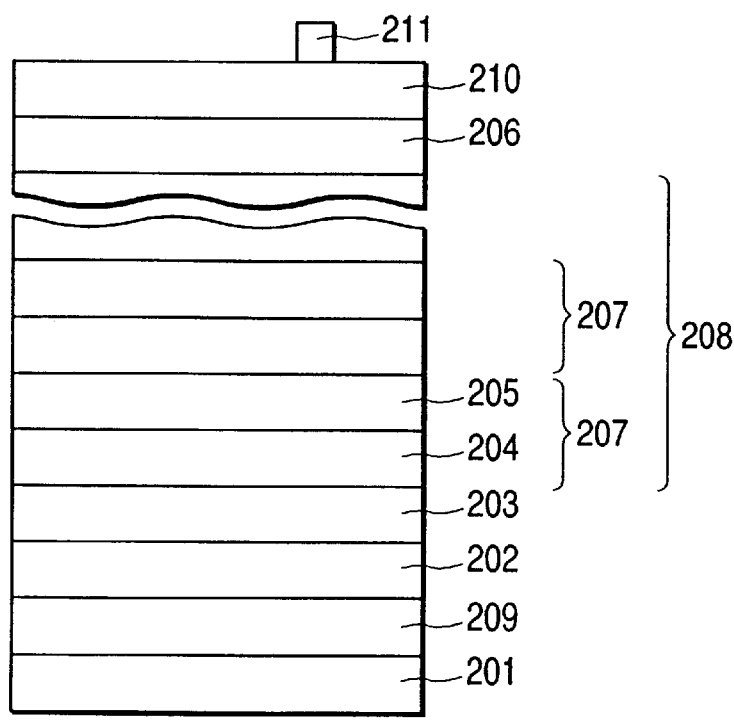
FIG. 2 is a schematic, sectional view to show a second embodiment of the photovoltaic element of the present invention.

FIG. 1 is a schematic diagram which shows a first form of the photovoltaic element of the present invention and FIG. 2 is a schematic diagram which shows a second form of the photovoltaic element of the present invention. FIG. 1 shows the form in which the light is incident from the side of the substrate 101, and FIG. 2 the form in which the light is incident from the opposite side to the substrate 201. Each layer will be described in detail.

(Substrate)

Since the semiconductor layers 103 to 106, 203 to 206 are thin films of at most about 1 $\mu$m, they are deposited on the appropriate support substrate 101, 201. The substrate 101, 201 may be monocrystal or non-monocrystal and may be either electrically conductive or electrically insulative. Further, the substrate 201 may be either transparent or opaque, but it preferably has the desired strength while having less deformation and distortion. The substrate 101 of FIG. 1 needs to be transparent.

Specifically, materials applicable for the substrate are metals, such as Fe, Ni, Cr, Al, Mo, Au, Nb, Ta, V, Ti, Pt, Pb, etc., alloys thereof. For example, such alloys are: thin plates of brass, stainless steel, and the like, and composites thereof; films or sheets of heat-resistant synthetic resins such as polyester, polyethylene, polycarbonate, cellulose acetate, polypropylene, polyvinyl chloride, polyvinylidene chloride, polystyrene, polyamide, polyimide, polyether sulfone, epoxy, etc., or composites of these with glass fiber, carbon fiber, boron fiber, metal fiber, etc.; materials obtained by coating the surface of these metal thin plates, resin sheets, etc. with a metal thin film of a different material and/or with an electrically insulating thin film of $SiO_2$, $Si_3N_4$, $Al_2O_3$, AlN, or the like, by a surface coating process selected from the sputtering process, the evaporation process, the plating process, and the like; or glasses, ceramics, and so on.

When the support substrate is electrically conductive like a metal, or the like, it may be used directly as an electrode for extraction of current. When the support substrate is electrically insulative like the synthetic resin, or the like, it is preferable to preliminarily form the electrode for extraction of the current on the surface thereof, on the side where the deposited films are to be formed, by the surface process according to a method selected from the plating process, the evaporation process, the sputtering process, etc., of the so-called single metal or alloy such as Al, Ag, Pt, Au, Ni, Ti, Mo, W, Fe, V, Cr, Cu, stainless steel, brass, nichrome, $SnO_2$, $In_2O_3$, ZnO, ITO, etc., and a transparent conductive oxide (TCO).

Of course, even if the support substrate is the electrically conductive one of the metals, or the like, a metal thin film of a different kind, or the like, may also be provided on the side where the deposited films are to be formed on the support substrate for purposes of increasing the reflectance of long-wavelength light on the surface of the support substrate, preventing mutual diffusion of component elements between the support substrate material and the deposited films, and so on. In cases where the support substrate is relatively transparent and the photoelectric conversion element is of the layer structure in which the light is incident from the substrate side, it is preferable to preliminarily deposit a conductive thin film, such as the transparent conductive oxide, the metal thin film, or the like.

For using these materials for the support substrate, they are preferably provided in a sheet form, or in a roll form, in which a beltlike sheet is rolled around a cylindrical body. When the support substrate is one obtained by forming a thin film on the substrate, a thin film forming method is selected from the vacuum evaporation method, the sputtering method, the screen printing method, the dipping method, the plasma enhanced CVD method, and so on.

Smoothness of the surface of the support substrate is preferably the surface roughness Ra of not more than 5.0 μm. For forming roughness, the surface of the support substrate may be etched moderately with an acid solution, such as $HNO_3$, HF, HCl, $H_2SO_4$, or the like.

If flexibility is demanded, the thickness of the support member can be decrease as much as possible within the range where the function as a support body can be exhibited well. However, the thickness is normally not less than 10 μm, taking into account the production and handling of the support, the mechanical strength thereof, and so on.

(Back reflecting layer)

A back reflecting layer 109, 209 reflects the long-wavelength light not absorbed by the semiconductor layers 103 to 106, 203 to 206, toward the semiconductor layers 103 to 106, 203 to 206, to extend optical pathlengths in the semiconductor layers, thereby increasing the absorption of light by the semiconductor layers and the short-circuit current ($J_{SC}$) of the photovoltaic element.

Materials applicable for the back reflecting layer 109 are metals, such as gold, silver, copper, aluminum, magnesium, nickel, iron, chromium, molybdenum, tungsten, titanium, cobalt, tantalum, niobium, zirconium, and so on, or alloys such as copper aluminum, copper magnesium, stainless steel, and so on. Among them, particularly preferred materials are the metals with high reflectance, such as aluminum, magnesium, copper, silver, gold, and so on, and alloys thereof.

The surface of the back reflecting layer 109, 209 may be either smooth or uneven. When the back reflecting layer has the smooth surface property, it is desirable to decrease the thickness as much as possible within the range without causing decrease of reflectance. In cases where the internal stress is large enough as to cause delamination, it is preferable to adjust the thickness. When the uneven surface is formed, it is desirable in formation of film to set the temperature of formation in the range of not less than 150° C. and not more than 500° C., and it is preferable to adjust the thickness so as to achieve the desired uneven shape.

The back reflecting layer 109, 209 can be formed by evaporation methods, such as EB evaporation, sputter evaporation, etc., as well as by various CVD methods, plating methods, printing methods, and so on. It can also be formed by a roll-to-roll method.

(Transparent conductive layer)

Further, it is preferable to form a transparent conductive layer 102, 202 of ZnO, $SnO_2$, $In_2O_3$, ITO, $TiO_2$, CdO, $Cd_2SnO_4$, $Bi_2O_3$, $MoO_3$, $Na_xWO_3$, or the like, between the back reflecting layer 109, 209 and the semiconductor layers 103 to 106 and 203 to 206.

Methods suitable for formation of the transparent conductive layer 102, 202 are the vacuum evaporation method, the sputtering method, the CVD method, the spray method, the spin-on method, the electrodeposition method, the dipping method, and so on.

The optimum thickness of the transparent conductive layer 102, 202 differs depending upon its index of refraction, but a preferred thickness range is 50 nm to 10 μm. Further, for texturing the transparent conductive layer 102, 202, it is preferable to increase the substrate temperature during formation thereof to 200° C. or more.

(Semiconductor layers)

Materials for the semiconductor layers used in the present invention can be silicon, or alloys whose principal material is silicon.

Among the above semiconductor materials, the ones particularly preferred for the photovoltaic element of the present invention are the IV base and IV alloy base amorphous semiconductor materials, such as a-Si:H (abbreviation of hydrogenated amorphous silicon), a-Si:F, a-Si:H:F, a-SiGe:H, a-SiGe:F, a-SiGe:H:F, a-SiC:H, a-SiC:F, a-SiC:H:F, and so on, and the IV base and IV alloy base microcrystal semiconductor materials such as μc-Si:H (abbreviation of hydrogenated microcrystal silicon), μc-Si:F, μc-Si:H:F, μc-SiGe:H, μc-SiGe:F, μc-SiGe:H:F, μc-SiC:H, μc-SiC:F, μc-SiC:H:F, and so on.

The semiconductor layers can undergo valency control and bandgap control. Specifically, the control can be made by introducing a source compound containing an element as a valency controller or a bandgap controller, alone or in the form of a mixture with source gases used to deposit film or with a dilution gas into a film-forming space during formation of the semiconductor layer.

The semiconductor layers have a region doped in the p-type and a region doped in the n-type, at least in part by the valency control, thus forming at least one set of pin junction. If a plurality of pin junctions are stacked, the element will be of the so-called stack cell structure.

Further, the semiconductor layers are formed by either selecting one of the various CVD methods, such as the microwave plasma CVD process, the RF plasma CVD process, the photo-CVD process, the thermal CVD process, the MOCVD process, and so on; or the various evaporation methods, such as the EB evaporation, MBE, ion plating, ion beam process, and so on; the sputtering process, the spray process, the printing process, and so on. The process preferably employed in industries is the plasma enhanced CVD process for decomposing the source gases by plasma and depositing a film on the substrate. A reactor device can be selected from batch type devices, continuous deposition apparatus, etc., as occasion may demand.

Described below in further detail are the semiconductor layers made of the IV base and IV alloy base microcrystal semiconductor materials particularly preferable for the photovoltaic element of the present invention.

(1) i-type semiconductor layer (intrinsic semiconductor layer) 108, 208

Particularly, in the photoelectric conversion elements using the IV base and IV alloy base microcrystal semiconductor materials, the i-type layer 108, 208 used for the pin junction is an important layer for generating and transporting carriers against irradiation light.

It is also possible to use a slight p-type layer or a slight n-type layer as the i-type layer.

The IV base and IV alloy base microcrystal semiconductor materials contain hydrogen atoms (H, D) or halogen atoms (X), as described above, which have important functions.

The hydrogen atoms (H, D) or halogen atoms (X) in the i-type layer function to compensate for unbound bonds (dangling bonds) of the i-type layer and function to seal the grain boundaries, thus improving mobility and lifetime of carriers in the i-type layer. They also function to compensate for interface states at each interface between the p-type layer and the i-type layer, or between the n-type layer and the i-type layer, to present the effect of improving the photovoltage, photocurrent, and optical response of the photoelectric conversion element.

Further, in the case of the stack type photoelectric conversion elements, it is preferable to use a material with a wide bandgap as a material for the i-type semiconductor layer in the pin junction close to the light incidence side and use a material with narrow bandgap as a material for the i-type semiconductor layer in the pin junction distant from the light incidence side.

Microcrystal silicons, microcrystal silicon germaniums, and microcrystal silicon carbides are expressed as follows according to the element compensating for the dangling bonds: $\mu$c-Si:H, $\mu$c-Si:F, $\mu$c-Si:H:F, $\mu$c-SiGe:H, $\mu$c-SiGe:F, $\mu$c-SiGe:H:F, $\mu$c-SiC:H, $\mu$c-SiC:F, $\mu$c-SiC:H:F, and so on.

When one unit 107, 207 is defined as a set of an i-type microcrystal silicon base semiconductor layer having a first absorption coefficient (hereinafter referred to as "first i-type microcrystal semiconductor layer") 104, 204 and an i-type microcrystal silicon base semiconductor layer having a second absorption coefficient different from the first absorption coefficient (hereinafter referred to as "second i-type microcrystal semiconductor layer") 105, 205, the i-type semiconductor layer 108, 208 includes at least two said units 107, 207.

The combination of the first i-type microcrystal semiconductor layer 104, 204 with the second i-type microcrystal semiconductor layer 105, 205 is, for example, one selected from the following:

a combination of layers having the same composition but different film structures, thus having different absorption coefficients;

a combination of layers having different compositions (a combination of $\mu$c-Si:H with $\mu$c-SiGe:H, a combination of $\mu$c-Si:H with $\mu$c-SiC:H, a combination of $\mu$c-SiC:H with $\mu$c-SiGe:H, etc.);

a combination of layers containing different types of elements, hydrogen atoms (H, D) or halogen atoms (X), or a combination of layers having different contents of hydrogen or halogen (a combination of $\mu$c-Si:H with $\mu$c-Si:F, a combination of $\mu$c-Si:H with $\mu$c-Si:H:F, a combination of $\mu$c-Si:F with $\mu$c-Si:H:F, etc.). The number of units is preferably 2 to 50.

Further, the thickness of each i-type layer 104, 105, 204, 205 is desirably about 10 nm to 1 $\mu$m and the thicknesses of the first i-type microcrystal semiconductor layer 104, 204 and the second i-type microcrystal semiconductor layer 105, 205 do not always have to be equal. It is also possible to employ the structure of the same thickness or the structure of different thicknesses between units. The overall thickness of the i-type layer is preferably about 1 $\mu$m to 10 $\mu$m.

The structure can include an i-type microcrystal semiconductor layer, except for the first and second i-type microcrystal semiconductor layers, and an i-type amorphous semiconductor layer.

The first and second i-type microcrystal semiconductor layers are both preferably of the columnar crystal structure.

The average grain size of the first i-type microcrystal semiconductor layer and the average grain size of the second i-type microcrystal semiconductor layer are desirably different from each other, and the average grain sizes are preferably 3 nm to 200 nm.

Further, the crystal volume percentage of the first i-type microcrystal semiconductor layer and the crystal volume percentage of the second i-type microcrystal semiconductor layer are desirably different from each other, and the crystal volume percentages are preferably 30% to 99%.

The hydrogen content of the first i-type microcrystal semiconductor layer and the hydrogen content of the second i-type microcrystal semiconductor layer are desirably different from each other, and the hydrogen contents are preferably 1 atom % to 40 atom %.

In addition, it is desirable that the portion of the i-type layer in contact with the p-layer be an amorphous silicon base semiconductor layer and that the thickness thereof be 5 nm to 30 nm, and it is further desirable that the thickness be preferably 10 nm to 20 nm.

(2) p-type semiconductor layer or n-type semiconductor layer 103, 106, 203, 206

Each of the first conduction type semiconductor layer 103, 203 and the second conduction type semiconductor layer 106, 206 is a p-type semiconductor layer or an n-type semiconductor layer (the order is irrelevant). Amorphous materials (indicated by a-) or microcrystal materials (indicated by $\mu$c-) for the p-type semiconductor layer, or the n-type semiconductor layer, are for example, the following materials doped with a high concentration of a p-type valency controller (atoms of Group III of the periodic table such as B, Al, Ga, In, and Tl) or an n-type valency controller (atoms of Group V of the periodic table such as P, As, Sb, and Bi): a-Si:H, a-Si:HX, a-SiC:H, a-SiC:HX, a-SiGe:H, a-SiGe:HX, a-SiGeC:H, a-SiGeC:HX, a-SiO:H, a-SiO:HX, a-SiN:H, a-SiN:HX, a-SiON:H, a-SiON:HX, a-SiOCN:H, a-SiOCN:HX, $\mu$c-Si:H, $\mu$c-Si:HX, $\mu$c-SiC:H, $\mu$c-SiC:HX, $\mu$c-SiO:H, $\mu$c-SiO:HX, $\mu$c-SiN:H, $\mu$c-SiN:HX, $\mu$c-SiGeC:H, $\mu$c-SiGeC:HX, $\mu$c-SiON:H, $\mu$c-SiON:HX, $\mu$c-SiOCN:H, $\mu$c-SiOCN:HX, and so on.

Particularly, for the p-type layer or the n-type layer on the light incidence side, a crystalline semiconductor layer with little absorption of light or an amorphous semiconductor layer with a wide bandgap is suitable.

The optimum addition amount of the atoms of Group III of the periodic table in the p-type layer and the optimum addition amount of the atoms of Group V of the periodic table in the n-type layer is 0.1 to 50 atom %.

The hydrogen atoms (H, D) or halogen atoms (X) in the p-type layer or in the n-type layer function to compensate for the unbound bonds of the p-type layer or the n-type layer, thus increasing the doping efficiency of the p-type layer or the n-type layer. The optimum amount of the hydrogen atoms or halogen atoms added in the p-type layer or in the n-type layer is 0.1 to 40 atom %. Particularly, when the p-type layer or the n-type layer is crystalline, the optimum amount of hydrogen atoms or halogen atoms is 0.1 to 8 atom %.

As to the electrical characteristics of the p-type layer and the n-type layer of the photoelectric conversion element, the activation energy is preferably not more than 0.2 eV, and most preferably, not more than 0.1 eV. Further, the specific resistance is preferably not more than 100 $\Omega$ cm, and most preferably, not more than 1 $\Omega$ cm. Further, the thickness of the p-type layer and n-type layer is preferably 1 to 50 nm, and most preferably, 3 to 20 nm.

The first conduction type semiconductor layer (of the n-type or the p-type) 103, 203 preferably contains a plurality of microcrystalline silicon base semiconductors of at least one layer. Further, the first conduction type semiconductor layer preferably has the structure of an amorphous silicon base semiconductor layer and plural microcrystalline silicon base semiconductors with at least one layer stacked in order.

The second conduction type semiconductor layer (of the n-type or the p-type) 106, 206 preferably contains a plurality of microcrystalline silicon base semiconductors of at least one layer. Further, the second conduction type semiconductor layer preferably has the structure of an amorphous silicon base semiconductor layer and plural microcrystalline silicon base semiconductors with at least one layer stacked in order.

(3) Forming methods of semiconductor layers

Production methods preferably applicable for formation of the amorphous silicon base semiconductor layers, or the microcrystal silicon base semiconductor layers suitable for the semiconductor layers of the photovoltaic element of the present invention, are the plasma enhanced CVD methods using ac or high frequency, such as the RF plasma CVD process, or the microwave plasma CVD process, or the like.

The microwave plasma CVD process is used to form a desired deposited film on the substrate placed in a deposition chamber in such a way that feed gases, such as source gases, dilution gases, etc., are introduced into the depressurizable deposition chamber (vacuum chamber), the internal pressure of the deposition chamber is kept constant with evacuating the inside by a vacuum pump, and a microwave oscillated by a microwave power supply is guided by a waveguide tube through a dielectric port (alumina ceramics etc.) into the deposition chamber, or to an antenna provided in the deposition chamber, to induce a plasma of the feed gases and decompose them, thereby depositing the film on the substrate. The microwave CVD process permits the deposited films applicable to the photovoltaic element to be formed under wide deposition conditions.

When the amorphous silicon base semiconductor layers and the microcrystal silicon base semiconductor layers for the photovoltaic element of the present invention are deposited by the microwave plasma CVD process, the preferred ranges of conditions are as follows: the substrate temperature in the deposition chamber is 100 to 450° C., the internal pressure 5 to 900 mTorr, the microwave power 0.01 to 100 W/cm$^3$, and the frequency of the microwave 0.1 to 10 GHz.

In the case of the deposition by the RF plasma CVD process, the preferred conditions are as follows: the substrate temperature in the deposition chamber is 100 to 350 ° C., the internal pressure is 0.1 to 10 Torr, RF power 0.001 to 50.0 W/cm$^2$, and the deposition rate is 0.1 to 30 Å/sec.

The source gases suitable for the deposition of the amorphous silicon base semiconductor layers and the microcrystal silicon semiconductor layers preferably applicable to the photovoltaic element of the present invention are gasifiable compounds containing silicon atoms, gasifiable compounds containing germanium atoms, gasifiable compounds containing carbon atoms, etc., and mixed gases of such compounds.

Specific examples of the gasifiable compounds containing silicon atoms are chain or cyclic silane compounds; specifically, for example, gas-state or readily gasifiable compounds of $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SIFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)$, $SiBr_4$, $(SiBr_2)_5$, $Si_2Cl_6$, $SiHCl_3$, $SiH_2Br_2$, $SiH_2Cl_2$, $Si_2Cl_3F_3$, and so on.

Specific examples of the gasifiable compounds containing germanium atoms are $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, $Ge_2D_6$, and so on.

Specific examples of the gasifiable compounds containing carbon atoms are $CH_4$, $CD_4$, $C_nH_{2n+2}$ (n is an integer), $C_nH_{2n}$ (n is an integer), $C_2H_2$, $C_6H_6$, $CO_2$, CO, and so on.

Examples of nitrogen-containing gases are $N_2$, $NH_3$, $ND_3$, NO, $NO_2$, $N_2O$, and so on.

Examples of oxygen-containing gases are $O_2$, CO, $CO_2$, NO, $NO_2$, $N_2O$, $CH_3CH_2OH$, $CH_3OH$, and so on.

Substances introduced into the p-type layer or into the n-type layer for valency control are the atoms of Group III and Group V of the periodic table.

Materials effectively used as starting substances for introduction of the atoms of Group III are as follows. Specifically, examples for introduction of boron atoms are boron hydrides, such as $B_2H_6$, $B_4H_{10}$, $B_5H_9$, $B_5H_{11}$, $B_6H_{10}$, $B_6H_{12}$, $B_6H_{14}$, and so on, boron halides such as $BF_3$, $BCl_3$, and so on, and the like. In addition, other examples include $AlCl_3$, $GaCl_3$, $InCl_3$, $TlCl_3$, and so on. Particularly, $B_2H_6$ and $BF_3$ are suitable.

Materials effectively used as starting substances for introduction of the atoms of Group V are as follows. Specifically, examples for introduction of phosphorus atoms are phosphorus hydrides, such as $PH_3$, $P_2H_4$, and so on; phosphorus halides, such as $PH_4I$, $PF_3$, $PF_5$, $PCl_3$, $PCl_5$, $PBr_3$, $PBr_5$, $PI_3$, and so on. Other examples include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, and so on. Particularly, $PH_3$ and $PF_3$ are suitable.

The above gasifiable compounds may be introduced into the deposition chamber in a properly diluted state with a gas, such as $H_2$, He, Ne, Ar, Xe, Kr, or the like, if necessary.

(Transparent electrode)

The transparent electrode 110, 210 used in the present invention functions as an electrode on the light incidence side to transmit the light and also functions as an antireflection film based on optimization of the thickness thereof. Required properties of the transparent electrode 110, 210 are high transmittances in the wavelength region that the semiconductor layers can absorb, and a low resistivity. Specifically, the transmittances at the wavelengths of 550 nm and above are preferably not less than 80% and more preferably not less than 85%. The resistivity is preferably not more than $5\times10^{-3}$ Ω cm and, more preferably, not more than $1\times10^{-3}$ Ω cm. Materials suitably applicable for the transparent electrode are conductive oxides, such as $In_2O_3$, $SnO_2$, $ITO(In_2O_3+SnO_2)$, ZnO, CdO, $Cd_2SnO_4$, $TiO_2$, $Ta_2O_5$, $Bi_2O_3$, $MoO_3$, $Na_xWO_3$, and so on, or mixtures thereof. It is particularly preferable that, the transparent electrode is made of a metal oxide selected from $SnO_2$, $In_2O_3$, and ITO, or one of composite oxides thereof.

These compounds may contain an element (dopant) for changing the electric conductivity. Examples of the elements (dopants) for changing the electric conductivity, which are preferably applicable, are Al, In, B, Ga, Si, F, etc., in the case of the transparent electrode 110, 210 of ZnO; Sn, F, Te, Ti, Sb, Pb, etc., in the case of the transparent electrode of $In_2O_3$; and F, Sb, P, As, In, Tl, Te, W, Cl, Br, I, etc. in the case of the transparent electrode of $SnO_2$.

Preferred methods for formation of the transparent electrode 110, 210 are the various evaporation methods, such as the EB evaporation, sputter evaporation, etc., the various CVD methods, spray methods, spin-on methods, dipping methods, and so on.

(Collector electrode)

The collector electrode 211 used in the present invention is formed in portions on the transparent electrode 210 according to the necessity where the resistivity of the transparent electrode 210 is not low enough. The collector electrode 211 functions to lower the resistivity of the electrode and lower the series resistance of photoelectric conversion elements. Materials applicable for the collector electrode are metals such as gold, silver, copper, aluminum, nickel, iron, chromium, molybdenum, tungsten, titanium, cobalt, tantalum, niobium, zirconium, and so on; or alloys such as stainless steel; or conductive pastes using powdered metal, and so on. The collector electrode is formed in such a shape as to intercept as little incident light to the semiconductor layer as possible.

The occupying area of the collector electrode in the overall area of the photovoltaic element is preferably not more than 15%, more preferably not more than 10%, and, most preferably not more than 5%.

A mask is used to form the pattern of the collector electrode and a forming method is selected from the evaporation method, the sputtering method, the plating method, the printing method, and so on.

For producing a photovoltaic device (module or panel) of desired output voltage and output current by use of the photovoltaic elements of the present invention, the photovoltaic elements of the present invention are connected in series or in parallel, a protection layer is formed on each of the front surface and back surface, and the electrodes for extraction of output, etc., are attached thereto. On this occasion, there are also cases where the substrate with the photovoltaic elements formed thereon is placed on another support substrate. When the photovoltaic elements of the present invention are connected in series, there are cases where diodes for prevention of reverse flow are incorporated.

(Module)

The module incorporating the photovoltaic elements of the present invention preferably has flexibility in order to facilitate its fixing work onto a building material. For that purpose, a preferred example of the module incorporating the photovoltaic elements of the present invention is such that the photovoltaic elements are placed on a flexible substrate and the surface layer on the light incidence side is covered by a light-transmitting material that is weather resistance and flexible. For example, applicable materials include a double-layered structure of fluororesin film/EVA (ethylene-vinyl acetate copolymer) (the fluororesin film on the light incidence side), silicone resin, fluororesin, fluorine-containing resin, acrylic silicone, polyester, nylon, etc. For protection of the module, nonwoven glass fabric may be put in the above resin.

(Building material)

There are no specific restrictions on the roof materials used in the present invention as long as they have sufficient weather resistance. For example, applicable materials are galvanized steel sheets, Galvalume sheets, steel sheets obtained by coating such materials with a weather-resistant substance, such as fluororesin or polyvinyl chloride, titanium, stainless steel sheets, ceramics, resins with weather resistance, etc.

A form of the building material of the present invention is preferably obtained by passing a metal sheet through a machine having a roller shaped bending die tool to effect continuous plasticity processing in the longitudinal direction and, more preferably, a long type form building material installed, for example, by a vertical roofing method, such as the folded plate structure roofing, the batten seam roofing, or the like. However, the form of the building material is not limited to these examples. Ordinary shapes of building materials are preferably applicable. This permits us to employ the conventional installation methods of the building materials.

(Installation method)

The installation method is preferably selected from the conventional installation methods. For example, the roof materials elongated from the ridge to the eaves are roofed from left to right when observed from the eaves side, like in the vertical roofing methods, such as the batten seam roofing, or the like.

Installation procedures are as follows. The roof materials are attached by spot welding to retaining clips fixed to members on the sheathing roof board side of the roof with screws. After that, the roof materials are fixed to each other by resistance seam welding.

The installation method briefly described above is suitable for roofing of large buildings and is popularly used at present.

Further, a horizontal roofing method is desirably applied for roofs of ordinary houses. The design performance achieved thereby is comparable to that of the ordinary roofs.

(Power generation system)

The dc power of the photovoltaic elements is subjected to power conversion in a power conversion device as the power conversion means and converted power is supplied to loads. Normally, a plurality of photovoltaic element modules are combined in series-parallel connection to compose a string or an array to obtain desired voltage and current.

The power conversion means is achieved by a conversion device and a conversion device driving circuit. The conversion device can be selected from the DC/DC converters using self-turn-off devices, such as power transistor, power MOSFET, IGBT, or the like, the self-excited voltage-fed DC/AC inverters, and so on. This conversion device can control the power flow, input/output power, output frequency, etc., by changing the on/off duty ratio of gate pulse.

The loads include electric heating loads, electric motor loads, or the commercial ac system, and combinations thereof.

The present invention will be described in further detail with examples thereof.

EXAMPLE 1

Figure 4:
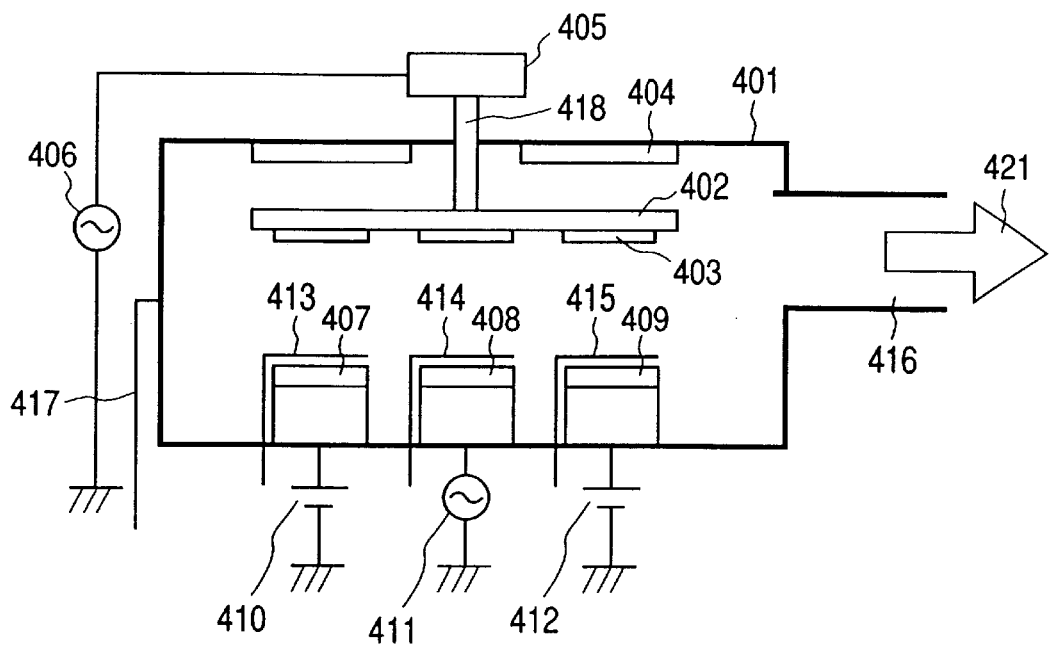
FIG. 4 is a schematic, sectional view to show a device for forming a back reflecting layer, a transparent electroconductive layer, and a transparent electrode of the photovoltaic element of the present invention.
Figure 5:
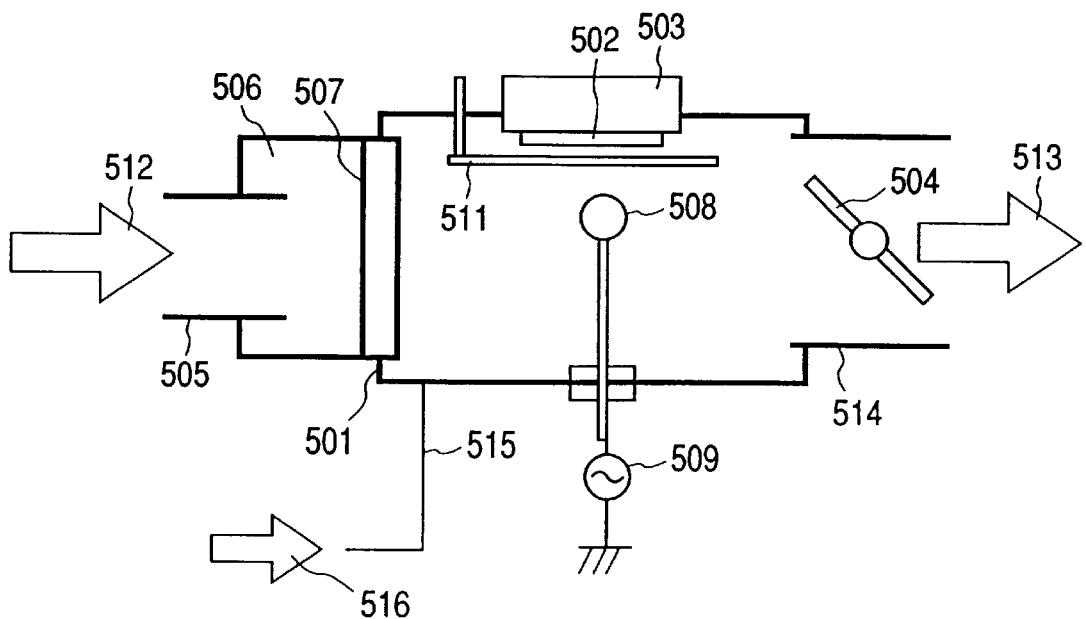
FIG. 5 is a schematic, sectional view to show a plasma CVD device for forming the photoelectric conversion layers of the photovoltaic element of the present invention.

The solar cell was produced in the structure of FIG. 1 by depositing the transparent electrode, using the deposition apparatus shown in FIG. 4, and depositing the photoelectric conversion layers (semiconductor layers), using the deposition apparatus shown in FIG. 5. Stacked in order, at this time were the p-type semiconductor layer ($\mu$c-Si:H, 15 nm), the i-type semiconductor layer composed of four units, each unit being a set of the first i-type microcrystal semiconductor layer ($\mu$c-Si:H, the absorption coefficient of 300 cm$^{-1}$ at 800 nm, the thickness of 200 nm), and the second i-type microcrystal semiconductor layer ($\mu$c-Si:H, the absorption coefficient of 1000 cm$^{-1}$ at 800 nm, the thickness of 300 nm), and the n-type semiconductor layer ($\mu$c-Si:H, 30 nm).

A source gas supply device (not illustrated) was connected through a gas inlet pipe 417 to the deposition apparatus shown in FIG. 4. A source gas bomb was an Ar gas bomb purified in ultrahigh purity, targets were Ag target 407, ZnO target 408, and ITO target 409, and sputtering was able to be carried out with switching the targets in vacuum. A bias power supply 406 was an RF power supply.

A source gas supply device (not illustrated) was connected through a gas inlet pipe 515 to the deposition apparatus of FIG. 5. All source gas bombs were those purified in ultrahigh purity and were SiH$_4$ gas bomb, SiF$_4$ gas bomb, CH$_4$ gas bomb, GeH$_4$ gas bomb, PF$_5$/H$_2$ (dilution rate: 1%) gas bomb, BF$_3$/H$_2$ (dilution rate: 1%) gas bomb, and H$_2$ gas bomb, connected to the apparatus.

The deposition of the transparent electrode was first carried out using the deposition apparatus shown in FIG. 4. In FIG. 4, reference numeral 401 designates a deposition chamber, 402 a substrate holder, 403 a substrate, 404 a heater, 405 a matching box, 406 an RF power supply (bias power supply), 407 a target of a metal comprised of Ag, 408 a target for the transparent conductive layer comprised of ZnO, 409 a target for the transparent electrode comprised of ITO, 410 and 412 DC power supplies, 411 an RF power supply, 413, 414, and 415 shutters, 416 an exhaust pipe, 417 a gas inlet pipe, 418 a rotational shaft, and 421 an exhaust direction.

The substrate 403 of polyether sulfone having the thickness of 0.5 mm and the size of 50 mm×50 mm was cleaned under an ultrasonic wave with acetone and isopropanol and dried with hot air. The substrate 403 was mounted on the substrate holder 402 of FIG. 4. The deposition chamber 401 was evacuated through the exhaust port 416 to which an oil diffusion pump was connected. When the pressure reached $2 \times 10^{-6}$ Torr, the Ar gas was introduced at 32 sccm through the gas inlet pipe 417 into the deposition chamber and the pressure was adjusted to 6 mTorr by a conductance valve (not illustrated). When the substrate temperature reached 150° C., the DC power of 300 W was applied from the DC sputter power supply 412 to the target electrode 409 to induce plasma. The target shutter 415 was opened to start deposition of film. The deposition rate was 19 Å/sec.

After a thin film layer of ITO was formed with the thickness of 0.7 μm on the substrate of polyether sulfone, the shutter was closed to extinguish the plasma.

FIG. 5 shows the apparatus capable of carrying out the plasma enhanced CVD process, in which reference numeral 501 designates a reaction chamber, 502 a substrate on which the transparent electrode or the transparent conductive layer was formed, 503 a heater, 504 a conductance valve, 505 a microwave guide tube, 506 a microwave inlet section, 507 a microwave inlet port of alumina-ceramic or the like, 508 an RF inlet section, 509 an RF power supply incorporating a matching circuit, 511 a shutter, 514 an exhaust pipe, and 515 a gas inlet pipe. Further, numeral 512 denotes a traveling direction of the microwave, 513 an exhaust direction, and 516 a gas introducing direction.

Although not illustrated, a microwave power supply is connected to the microwave guide tube 505, a vacuum pump is connected to the exhaust pipe 514, and a gas introducing device is connected to the gas inlet pipe 515. The plasma CVD apparatus is composed of the above members and the like.

The actual layer formation is carried out according to the following procedures by the microwave CVD process with this plasma CVD apparatus. First, the substrate 502 with the transparent electrode or the transparent conductive layer formed thereon is attached to the heater 503 inside the reaction chamber 501, and the inside of the reaction chamber is evacuated by the vacuum pump, such as an oil diffusion pump, or the like, so that the pressure inside the reaction chamber becomes $1 \times 10^{-4}$ Torr or below.

When the pressure reaches $1 \times 10^{-4}$ Torr or below, a gas, such as $H_2$, He, or the like, is introduced through the gas inlet pipe 515 into the reaction chamber and the heater is activated and set so that the substrate 502 is heated to a desired temperature.

When the temperature of the substrate is stabilized, the source gases are introduced through the gas inlet pipe 515 and the microwave power is guided from the unrepresented microwave power supply via the microwave guide tube 505, the microwave inlet section 506, and microwave inlet port 507 into the reaction chamber 501.

When the plasma 510 is induced, the conductance valve is adjusted so as to obtain the desired pressure and the RF power supply 509 is turned on to introduce the RF power from the RF inlet section 508. At that time, it is preferable to adjust the matching circuit so that the return power is at the minimum.

Next, the shutter 511 is opened to form a layer having a desired thickness. After completing the formation of the layer, the shutter 511 is closed and the introduction of the RF power, the microwave power, and the source gases is stopped. Then, preparation is carried out to form the next layer. For carrying out the RF plasma CVD process in this apparatus, only the RF power is introduced according to the above procedures to induce the plasma.

Next, the p-type layer, the i-type layer (the first layer, the second layer, . . . ), and the n-type layer were successively formed on the thin film layer of ITO, using the apparatus shown in FIG. 5. The p-type layer was formed by the RF plasma CVD process (RFPCVD process), the i-type layer by the microwave plasma CVD process (MWPCVD process), and the n-type layer by the RFPCVD process.

For forming the p-type layer, the $H_2$ gas was introduced at the predetermined rate under the conditions shown in Table 1. After the pressure inside the deposition chamber was stabilized at the pressure shown in Table 1 and the substrate temperature at the temperature shown in Table 1, the $SiH_4$ gas, the $BF_3/H_2$ gas, and the $H_2$ gas were set at the respective flow rates shown in Table 1 and the RF power was applied to the RF electrode (RF inlet section) to induce the plasma. Then the substrate shutter 511 was opened to start the formation of the p-type layer on the ITO thin film layer. After the formation of the p-type layer in the thickness of 15 nm, the substrate shutter 511 was closed and the RF power supply was turned off to extinguish the plasma, thus completing the formation of the p-type layer.

The flow of the $SiH_4$ gas and $BF_3/H_2$ into the deposition chamber was stopped, but the $H_2$ gas was directed to flow into the deposition chamber for two more minutes. After that, the flow of $H_2$ was also stopped and then the inside of the deposition chamber and the gas pipes was evacuated to $1 \times 10^{-5}$ Torr.

For forming the i-type layer, the dilution gas ($H_2$ or the like) was introduced at the predetermined rate under the conditions shown in Table 1, the pressure was adjusted to the pressure shown in Table 1, and the substrate temperature to the temperature shown in Table 1. After the substrate temperature was stabilized, the source gas ($SiH_4$, $GeH_4$, etc.) was allowed to flow in and adjustment was made so that the flow rate of the source gas became the predetermined rate, the flow rate of the dilution gas became the predetermined rate, and the pressure inside the deposition chamber became the pressure shown in Table 1.

After that, the power of the MW (microwave) power supply was set to the level shown in Table 1. Then the MW power was introduced through the dielectric port to induce the plasma, and the substrate shutter 511 was opened. At this time, the source gas and dilution gas were directed to flow at the respective rates, shown in Table 1, for the time (1000 sec) shown in Table 1, the power of the MW power supply was maintained at the predetermined power, and then the source gas and dilution gas were directed to flow at the respective rates, shown in Table 1 for the time (1600 sec) shown in Table 1. This operation was repeated four times. Thereafter, the substrate shutter 511 was closed and the MW power supply was turned off to extinguish the plasma, thus completing the formation of the i-type layer.

After the flow of the source gas was stopped, the dilution gas was directed to flow for one more minute and thereafter stopped. Then the inside of the deposition chamber and gas pipes were evacuated to $1 \times 10^{-5}$ Torr.

For forming the n-type layer, the $H_2$ gas was introduced at the predetermined rate under the conditions shown in Table 1 and setting was made so that the pressure inside the deposition chamber became the pressure shown in Table 1, and the substrate temperature became the temperature shown in Table 1. After the substrate temperature was stabilized, the $SiH_4$ gas and the $PF_5/H_2$ gas were allowed to flow in and an adjustment was made so that the flow rates of $SiH_4$ gas, $H_2$ gas, and $PF_5/H_2$ gas became the respective flow rates shown in Table 1, and the pressure became the pressure shown in Table 1.

After that, the power of the RF power supply was set to the predetermined power to induce the plasma and the substrate shutter 511 was opened to start the formation of the n-type layer on the i-type layer. After completing the formation of the n-type layer of the thickness of 30 nm, the substrate shutter 511 was closed and the RF power supply was turned off to extinguish the plasma, thus completing the formation of the n-type layer. After the flow of the $SiH_4$ gas and the $PF_5/H_2$ gas was stopped, the $H_2$ gas was directed to flow for two more minutes. After that, the flow of the $H_2$ gas was also stopped and the inside of the deposition chamber and gas pipes was evacuated to $1\times10^{-5}$ Torr. Then, the deposition chamber was made to leak.

Next, ZnO was deposited as the transparent conductive layer 102 in the thickness of 1.0 $\mu$m on the n-type layer by the RF sputtering method. Further, Ag was deposited as the back reflecting layer 109 in the thickness of 0.5 $\mu$m by the DC sputtering method. The deposition conditions of these layers were similar to those of ITO. The above concluded the production of the photovoltaic element. This photovoltaic element will be called SC Ex 1-1.

TABLE 1

| p-type layer (first conduction type semiconductor layer 103) | |
|---|---|
| $SiH_4$ | 2 sccm |
| $H_2$ | 300 sccm |
| $BF_3/H_2$ | 15 sccm |
| pressure | 1 mTorr |
| substrate temperature | 150° C. |
| RF power | 50 W |
| i-type layer 108 | |
| first i-type $\mu c$ semiconductor layer 104 | |
| $SiH_4$ (source gas) | 50 sccm |
| $H_2$ (dilution gas) | 700 sccm |
| deposition time | 1000 sec |
| pressure | 40 mTorr |
| substrate temperature | 150° C. |
| MW power | 20 W |
| second i-type $\mu c$ semiconductor layer 105 | |
| $SiH_4$ (source gas) | 50 sccm |
| $H_2$ (dilution gas) | 1500 sccm |
| deposition time | 1600 sec |
| pressure | 40 mTorr |
| substrate temperature | 150° C. |
| MW power | 20 W |
| n-type layer (second conduction type semiconductor layer 106) | |
| $SiH_4$ | 3 sccm |
| $H_2$ | 400 sccm |
| $PF_5/H_2$ | 10 sccm |
| pressure | 1 Torr |
| substrate temperature | 150° C. |
| RF power | 50 W |

Comparative Example 1-1

The photovoltaic element was prepared in the same manner as in Example 1, except that the i-type layer 108 was deposited with the thickness of 2 $\mu$m only under the conditions of the first i-type microcrystal semiconductor layer 104 ($\mu$c-Si:H, the absorption coefficient of 300 $cm^{-1}$ at 800 nm). This photovoltaic element will be called SC Comp Ex 1-1.

Comparative Example 1-2

The photovoltaic element was prepared in the same manner as in Example 1, except that the i-type layer 108 was deposited with the thickness of 2 $\mu$m only under the conditions of the second i-type microcrystal semiconductor layer 105 ($\mu$c-Si:H, the absorption coefficient of 1000 $cm^{-1}$ at 800 nm). This photovoltaic element will be called SC Comp Ex 1-2.

The photovoltaic elements SC Ex 1-1, SC Comp Ex 1-1, and SC Comp Ex 1-2 were subjected to a measurement of initial photoelectric conversion efficiency (photovoltage/incident light power), a light degradation test, a vibration degradation test, a bending test, a twisting test, and a hail test.

The measurement of initial photoelectric conversion efficiency was achieved by measuring the I–V characteristics while the solar cell produced was set under AM-1.5 (100 mW/$cm^2$) light illumination.

The light degradation test was carried out as follows. The photovoltaic element, after the measurement of initial photoelectric conversion efficiency, was set under the condition of 50% humidity at a temperature of 25° C. and exposed to the illumination of AM-1.5 (100 mW/$cm^2$) light for 500 hours. The photovoltaic element was evaluated by a ratio of the photoelectric conversion efficiency under the light irradiation after the 500-hour exposure to the initial photoelectric conversion efficiency (i.e., the photoelectric conversion efficiency after the light degradation test/the initial photoelectric conversion efficiency).

The vibration degradation test was carried out as follows. The photovoltaic element, after the measurement of initial photoelectric conversion efficiency, was set in a dark space under the 50% humidity and a temperature of 25° C. and was vibrated at a frequency of 60 Hz and the amplitude of 0.1 mm for 500 hours. After the 500-hour vibration, the photoelectric conversion efficiency of the photovoltaic element was measured under the AM-1.5 (100 mW/$cm^2$) light irradiation. The photovoltaic element was evaluated by a ratio of the photoelectric conversion efficiency under AM-1.5 after the 500-hour vibration to the initial photoelectric conversion efficiency (i.e., the photoelectric conversion efficiency after the vibration degradation test/the initial photoelectric conversion efficiency).

The bending test was carried out as follows. First, stacked on a support substrate (hot-dip galvanized steel sheet) 1 mm thick were EVA, nylon resin, EVA, nonwoven glass fabric, the photovoltaic element, nonwoven glass fabric, EVA, nonwoven glass fabric, EVA, nonwoven glass fabric, and fluororesin. They were subjected to vacuum sealing (lamination), thereby preparing a solar cell module. This solar cell module was bent to be plastically deformed up to the bending angle of 150°. After that, the surface of the solar cell module was visually observed and the photoelectric conversion efficiency thereof was measured.

The solar cell module was prepared in the similar fashion to the above bending test and was subjected to the "twisting test" pursuant to JIS C8917A-10 section for crystalline solar cells. The test condition was 50 repetitions of twisting at the height h=5 mm in the area of 10 cm×10 cm. The surface of the solar cell module was visually observed and the photoelectric conversion efficiency thereof was measured after the test.

The solar cell module was prepared in the similar fashion to the above bending test and was subjected to the hail test described in JIS C8917 associated with the crystalline solar cells. The diameter of water balls was 25 mm and the water balls were made to drop all over ten times with the terminal velocity of 23 m/sec. The surface of the solar cell module was visually observed and the photoelectric conversion efficiency thereof was measured after the test.

SC Ex 1-1, SC Comp Ex 1-1, and SC Comp Ex 1-2 showed the results of the measurement of the initial photoelectric conversion efficiency, the rate of the photoelectric conversion efficiency after the light degradation, the rate of the photoelectric conversion efficiency after the vibration degradation, the bending test, the twisting test, and the hail test, as indicated in Table 2. The photoelectric conversion efficiencies in Table 2 are relative values with respect to that of SC Ex 1-1 being defined as 1.00.

TABLE 2

| Sample No. | Initial conversion efficiency | After optical degradation | After vibration degradation | Bending test vision | Bending test conversion efficiency | Twisting test vision | Twisting test conversion efficiency | Hail test vision | Hail test conversion efficiency | Overall rank |
|---|---|---|---|---|---|---|---|---|---|---|
| SC Ex 1-1 | 1.00 | 1.00 | 1.00 | no peel | 1.00 | no peel | 1.00 | no peel | 1.00 | o |
| SC Comp Ex 1-1 | 0.95 | 0.85 | 0.91 | peel observed | 0.91 | no peel | 0.95 | no peel | 0.97 | X |
| SC Comp Ex 1-2 | 0.80 | 0.99 | 0.87 | peel observed | 0.85 | peel observed | 0.91 | peel observed | 0.95 | X |

From the above results, it was verified that SC Ex 1-1 was superior to the comparative examples.

EXAMPLE 2

The photovoltaic element was produced in the structure of FIG. 1 by depositing the transparent electrode, the transparent conductive film, and the back reflecting layer in the similar fashion to that in Example 1 using the deposition apparatus shown in FIG. 4 and depositing the photoelectric conversion layers under the conditions of Table 3 using the deposition apparatus shown in FIG. 5.

In this example, the first deposited conduction type semiconductor layer 103 was a p-type semiconductor layer ($\mu$c-SiC:H, 20 nm).

Further, the i-type layer 108 was two units 107 successively stacked, each unit 107 being a set of the first i-type microcrystal semiconductor layer ($\mu$c-Si:H, the absorption coefficient of 400 cm$^{-1}$ at 800 nm, the thickness of 300 nm) 104 and the second i-type microcrystal semiconductor layer ($\mu$c-SiGe:H, the absorption coefficient of 1500 cm$^{-1}$ at 800 nm, the thickness of 400 nm) 105.

The second deposited conduction type semiconductor layer 106 was an n-type semiconductor layer ($\mu$c-Si:H, 40 nm). After that, the transparent conductive layer 102 and the back reflecting layer 109 were deposited in the similar fashion to those in Example 1. This photovoltaic element will be called SC Ex 2-1.

TABLE 3

| p-type layer (first conduction type semiconductor layer 103) | |
|---|---|
| SiH$_4$ | 2 sccm |
| CH$_4$ | 1 sccm |
| H$_2$ | 300 sccm |
| BF$_3$/H$_2$ | 15 sccm |
| pressure | 1 Torr |
| substrate temperature | 150° C. |
| RF power | 50 W |
| i-type layer 108 | |
| first i-type $\mu$c semiconductor layer 104 | |
| SiH$_4$ (source gas) | 50 sccm |
| H$_2$ (dilution gas) | 800 sccm |
| deposition time | 750 sec |

TABLE 3-continued

| | |
|---|---|
| pressure | 40 mTorr |
| substrate temperature | 150° C. |
| MW power | 20 W |
| second i-type $\mu$c semiconductor layer 105 | |
| SiH$_4$ (source gas) | 50 sccm |
| GeF$_4$ (source gas) | 5 sccm |
| H$_2$ (dilution gas) | 1800 sccm |
| deposition time | 1300 sec |
| pressure | 50 mTorr |
| substrate temperature | 150° C. |
| MW power | 20 W |
| n-type layer (second conduction type semiconductor layer 106) | |
| SiH$_4$ | 3 sccm |
| H$_2$ | 400 sccm |
| PF$_5$/H$_2$ | 10 sccm |
| pressure | 1 Torr |
| substrate temperature | 150° C. |
| RF power | 50 W |

Comparative Example 2-1

The photovoltaic element was prepared in the same manner as in Example 2, except that the i-type layer 108 was deposited with the thickness of 1.4 $\mu$m only under the conditions of the first i-type microcrystal semiconductor layer 104 ($\mu$c-Si:H, the absorption coefficient of 400 cm$^{-1}$ at 800 nm). This photovoltaic element will be called SC Comp Ex 2-1.

Comparative Example 2-2

The photovoltaic element was prepared in the same manner as in Example 2, except that the i-type layer 108 was deposited with the thickness of 1.4 μm only under the conditions of the second i-type microcrystal semiconductor layer 105 (μc-SiGe:H, the absorption coefficient of 1500 cm$^{-1}$ at 800 nm). This photovoltaic element will be called SC Comp Ex 2-2.

The photovoltaic elements SC Ex 2-1, SC Comp Ex 2-1, and SC Comp Ex 2-2 showed the results of the measurement of the initial photoelectric conversion efficiency, the rate of the photoelectric conversion efficiency after the light degradation, the rate of the photoelectric conversion efficiency after the vibration degradation, the bending test, the twisting test, and the hail test, as indicated in Table 4. The photoelectric conversion efficiencies in Table 4 are relative values with respect to that of SC Ex 2-1 being defined as 1.00.

TABLE 4

| Sample No. | Initial conversion efficiency | After optical degradation | After vibration degradation | Bending test vision | Bending test conversion efficiency | Twisting test vision | Twisting test conversion efficiency | Hail test vision | Hail test conversion efficiency | Overall rank |
|---|---|---|---|---|---|---|---|---|---|---|
| SC Ex 2-1 | 1.00 | 1.00 | 1.00 | no peel | 1.00 | no peel | 1.00 | no peel | 1.00 | ○ |
| SC Comp Ex 2-1 | 0.95 | 0.85 | 0.92 | peel observed | 0.92 | no peel | 0.93 | no peel | 0.98 | X |
| SC Comp Ex 2-2 | 0.75 | 0.87 | 0.93 | peel observed | 0.88 | peel observed | 0.89 | peel observed | 0.93 | X |

From the above results, it was verified that SC Ex 2-1 was superior to the comparative examples.

EXAMPLE 3

The photovoltaic element was produced in the structure of FIG. 2 by using a stainless steel substrate (SUS304) having the thickness of 0.2 mm and the size of 50 mm×50 mm, as the substrate 201, depositing the back reflecting layer (Ag, 450 nm) 209 and the transparent conductive layer (ZnO, 1 μm) 202 using the deposition apparatus shown in FIG. 4, and depositing the photoelectric conversion layers under the conditions of Table 5 using the deposition apparatus shown in FIG. 5.

In this example, the first conduction type semiconductor layer 203 deposited was an n-type semiconductor layer (μc-Si:H, 20 nm).

The i-type layer 208 was six units 207 successively stacked, each unit 207 being a set of the first i-type microcrystal semiconductor layer (μc-Si:H, the absorption coefficient of 400 cm$^{-1}$ at 800 nm, the thickness of 150 nm) 204 and the second i-type microcrystal semiconductor layer (μc-Si:H:F, the absorption coefficient of 800 cm$^{-1}$ at 800 nm, the thickness of 100 nm) 205.

Further, the second deposited conduction type semiconductor layer 206 was a p-type semiconductor layer (μc-Si:H, 20 nm). After that, ITO was deposited as the transparent electrode 210 with the thickness of 600 nm by the sputtering method and Al was further deposited as the collector electrode 211 with the thickness of 1.0 μm by the sputtering method. This photovoltaic element will be called SC Ex 3-1. The deposition conditions of the layers, except for the photoelectric conversion layers, were similar to those in Example 1.

TABLE 5

| p-type layer (second conduction type semiconductor layer 206) | |
|---|---|
| SiH$_4$ | 2 sccm |
| H$_2$ | 300 sccm |
| BF$_3$/H$_2$ | 15 sccm |
| pressure | 1 Torr |
| substrate temperature | 200° C. |
| RF power | 50 W |
| i-type layer 208 | |
| first i-type μc semiconductor layer 204 | |
| SiH$_4$ (source gas) | 55 sccm |
| H$_2$ (dilution gas) | 800 sccm |

TABLE 5-continued

| | |
|---|---|
| deposition time | 900 sec |
| pressure | 40 mTorr |
| substrate temperature | 250° C. |
| MW power | 20 W |
| second i-type μc semiconductor layer 205 | |
| SiH$_4$ (source gas) | 30 sccm |
| SiF$_4$ (source gas) | 20 sccm |
| H$_2$ (dilution gas) | 1600 sccm |
| deposition time | 1600 sec |
| pressure | 40 mTorr |
| substrate temperature | 250° C. |
| MW power | 30 W |
| n-type layer (first conduction type semiconductor layer 203) | |
| SiH$_4$ | 3 sccm |
| H$_2$ | 400 sccm |
| PF$_5$/H$_2$ | 10 sccm |
| pressure | 1 Torr |
| substrate temperature | 150° C. |
| RF power | 50 W |

Comparative Example 3-1

The photovoltaic element was prepared in the same manner as in Example 3, except that the i-type layer 208 was deposited with the thickness of 1.5 μm only under the conditions of the first i-type microcrystal semiconductor layer 204 (μc-Si:H, the absorption coefficient of 400 cm$^{-1}$ at 800 nm). This photovoltaic element will be called SC Comp Ex 3-1.

Comparative Example 3-2

The photovoltaic element was prepared in the same manner as in Example 3, except that the i-type layer 208 was deposited with the thickness of 1.5 μm only under the conditions of the second i-type microcrystal semiconductor layer 205 (μc-Si:H:F, the absorption coefficient of 800 cm$^{-1}$ at 800 nm). This photovoltaic element will be called SC Comp Ex 3-2.

The photovoltaic elements SC Ex 3-1, SC Comp Ex 3-1, and SC Comp Ex 3-2 showed the results of the measurement of the initial photoelectric conversion efficiency, the rate of the photoelectric conversion efficiency after the light degradation, the rate of the photoelectric conversion efficiency after the vibration degradation, the bending test, the twisting test, and the hail test, as indicated in Table 6. The photoelectric conversion efficiencies in Table 6 are relative values with respect to that of SC Ex 3-1 being defined as 1.00.

TABLE 6

| Sample No. | Initial conversion efficiency | After optical degradation | After vibration degradation | Bending test vision | Bending test conversion efficiency | Twisting test vision | Twisting test conversion efficiency | Hail test vision | Hail test conversion efficiency | Overall rank |
| --- | --- | --- | --- | --- | --- | --- | --- | --- | --- | --- |
| SC Ex 3-1 | 1.00 | 1.00 | 1.00 | no peel | 1.00 | no peel | 1.00 | no peel | 1.00 | ○ |
| SC Comp Ex 3-1 | 0.95 | 0.90 | 0.95 | no peel | 0.94 | no peel | 0.97 | no peel | 0.97 | X |
| SC Comp Ex 3-2 | 0.85 | 0.93 | 0.86 | peel observed | 0.82 | peel observed | 0.85 | peel observed | 0.90 | X |

From the above results, it was verified that SC Ex 3-1 was superior to the comparative examples.

EXAMPLE 4

The photovoltaic element was produced in the structure of FIG. 2 by using the stainless steel substrate (SUS304) having the thickness of 0.2 mm and the size of 50 mm×50 mm as the substrate 201, depositing the back reflecting layer (Ag, 450 nm) 209 and the transparent conductive layer (ZnO, 1 μm) 202 using the deposition apparatus shown in FIG. 4, and depositing the photoelectric conversion layers under the conditions of Table 7 using the deposition apparatus shown in FIG. 5.

In this example, the first deposited conduction type semiconductor layer 203 was an n-type semiconductor layer (μc-Si:H, 20 nm).

The i-type layer 208 consisted of three units successively deposited in the structure of the first i-type microcrystal semiconductor layer (μc-Si:H, the absorption coefficient of 300 cm$^{-1}$ at 800 nm) 204 having the thickness of 400 nm, the second i-type microcrystal semiconductor layer (μc-Si:H, the absorption coefficient of 900 cm$^{-1}$ at 800 nm) 205 having the thickness of 500 nm, the first i-type microcrystal semiconductor layer 204 having the thickness of 300 nm, the second i-type microcrystal semiconductor layer 205 having the thickness of 200 nm, the first i-type microcrystal semiconductor layer 204 having the thickness of 100 nm, and the second i-type microcrystal semiconductor layer 205 having the thickness of 200 nm.

The second conduction type semiconductor layer 206 deposited was a p-type semiconductor layer (μc-Si:H, 20 nm). After that, the transparent electrode and collector electrode were deposited in the similar fashion to those in Example 3. This photovoltaic element will be called SC Ex 4-1. The deposition conditions of the layers except for the photoelectric conversion layers were similar to those in Example 3.

TABLE 7

| p-type layer (second conduction type semiconductor layer 206) | |
| --- | --- |
| SiH$_4$ | 2 sccm |
| H$_2$ | 300 sccm |
| BF$_3$/H$_2$ | 15 sccm |
| pressure | 1 Torr |

TABLE 7-continued

| | |
| --- | --- |
| substrate temperature | 200° C. |
| RF power | 50 W |
| i-type layer 208 | |
| first i-type μc semiconductor layer 204 | |
| SiH$_4$ (source gas) | 55 sccm |
| H$_2$ (dilution gas) | 700 sccm |
| deposition time | 800 sec, |
| | 600 sec, |
| | 200 sec |
| pressure | 40 mTorr |
| substrate temperature | 250° C. |
| MW power | 20 W |
| second i-type μc semiconductor layer 205 | |
| SiH$_4$ (source gas) | 50 sccm |
| H$_2$ (dilution gas) | 1200 sccm |
| deposition time | 1500 sec, |
| | 600 sec, |
| | 600 sec |
| pressure | 40 mTorr |
| substrate temperature | 250° C. |
| MW power | 20 W |
| n-type layer (first conduction type semiconductor layer 203) | |
| SiH$_4$ | 3 sccm |
| H$_2$ | 400 sccm |
| PF$_5$/H$_2$ | 10 sccm |
| pressure | 1 Torr |
| substrate temperature | 150° C. |
| RF power | 50 W |

Comparative Example 4-1

The photovoltaic element was prepared in the same manner as in Example 4, except that the i-type layer 208 was deposited with the thickness of 1.7 μm only under the conditions of the first i-type microcrystal semiconductor layer 204 (μc-Si:H, the absorption coefficient of 300 cm$^{-1}$ at 800 nm). This photovoltaic element will be called SC Comp Ex 4-1.

Comparative Example 4-2

The photovoltaic element was prepared in the same manner as in Example 4, except that the i-type layer 208 was deposited with the thickness of 1.7 μm only under the conditions of the second i-type microcrystal semiconductor layer 205 (μc-Si:H, the absorption coefficient of 900 cm$^{-1}$ at 800 nm). This photovoltaic element will be called SC Comp Ex 4-2.

The photovoltaic elements SC Ex 4-1, SC Comp Ex 4-1, and SC Comp Ex 4-2 showed the results of the measurement of the initial photoelectric conversion efficiency, the rate of the photoelectric conversion efficiency after the light degradation, the rate of the photoelectric conversion efficiency after the vibration degradation, the bending test, the twisting test, and the hail test, as indicated in Table 8. The photoelectric conversion efficiencies in Table 8 are relative values with respect to that of SC Ex 4-1 being defined as 1.00.

Example 3. This photovoltaic element will be called SC Ex 5-1.

TABLE 9

| p-type layer (second conduction type semiconductor layer 206) | |
|---|---|
| SiH$_4$ | 2 sccm |
| H$_2$ | 300 sccm |
| BF$_3$/H$_2$ | 15 sccm |
| pressure | 1 Torr |
| substrate temperature | 200° C. |
| RF power | 50 W |
| i-type layer 208 | |
| first i-type μc semiconductor layer 204 | |
| SiH$_4$ (source gas) | 55 sccm |
| H$_2$ (dilution gas) | 700 sccm |
| deposition time | 200 sec |
| pressure | 40 mTorr |
| substrate temperature | 250° C. |
| MW power | 20 W |
| second i-type μc semiconductor layer 205 | |
| SiH$_4$ (source gas) | 30 sccm |
| SiF$_4$ (source gas) | 20 sccm |
| H$_2$ (dilution gas) | 1800 sccm |
| deposition time | 400 sec |
| pressure | 40 mTorr |

TABLE 8

| Sample No. | Initial conversion efficiency | After optical degradation | After vibration degradation | Bending test vision | Bending test conversion efficiency | Twisting test vision | Twisting test conversion efficiency | Hail test vision | Hail test conversion efficiency | Overall rank |
|---|---|---|---|---|---|---|---|---|---|---|
| SC Ex 4-1 | 1.00 | 1.00 | 1.00 | no peel | 1.00 | no peel | 1.00 | no peel | 1.00 | o |
| SC Comp Ex 4-1 | 0.95 | 0.83 | 0.95 | peel observed | 0.89 | no peel | 0.93 | no peel | 0.95 | X |
| SC Comp Ex 4-2 | 0.83 | 0.85 | 0.85 | no peel | 0.87 | no peel | 0.92 | no peel | 0.96 | X |

From the above results, it was verified that SC Ex 4-1 was superior to the comparative examples.

EXAMPLE 5

The photovoltaic element was produced in the structure of FIG. 2 in the similar fashion to that of Example 3, except that the photoelectric conversion layers were deposited under the conditions of Table 9.

In this example, the first conduction type semiconductor layer 203 deposited was an n-type semiconductor layer (μc-Si:H, 20 nm).

The i-type layer 208 was ten units 207 successively deposited, each unit 207 being a set of the first i-type microcrystal semiconductor layer (μc-Si:H, the absorption coefficient of 300 cm$^{-1}$ at 800 nm, the thickness of 70 nm) 204 and the second i-type microcrystal semiconductor layer (μc-Si:H:F, the absorption coefficient of 600 cm$^{-1}$ at 800 nm, the thickness of 80 nm) 205.

Further, the second conduction type semiconductor layer 206 deposited was a p-type semiconductor layer (μc-Si:H, 20 nm). After that, the transparent electrode and collector electrode were deposited in the similar fashion to those in TABLE 9-continued

| substrate temperature | 250° C. |
|---|---|
| MW power | 30 W |
| n-type layer (first conduction type semiconductor layer 203) | |
| SiH$_4$ | 3 sccm |
| H$_2$ | 400 sccm |
| PF$_5$/H$_2$ | 10 sccm |
| pressure | 1 Torr |
| substrate temperature | 300° C. |
| RF power | 50 W |

Comparative Example 5-1

The first i-type microcrystal semiconductor layer (μc-Si:H, the absorption coefficient of 300 cm$^{-1}$ at 800 nm, the thickness of 70 nm) 204 was formed so that the absorption coefficient and the thickness thereof were the same as in Example 5, but the production conditions thereof were changed to those shown in Table 10. The photovoltaic element was prepared in the same manner as in Example 5, except for the above. This photovoltaic element will be called SC Comp Ex 5-1.

TABLE 10

| | |
|---|---|
| SiH₄ (source gas) | 55 sccm |
| H₂ (dilution gas) | 1000 sccm |
| deposition time | 700 sec |
| pressure | 800 mTorr |
| substrate temperature | 300° C. |
| MW power | 100 W |

Comparative Example 5-2

The second i-type microcrystal semiconductor layer (μc-Si:H:F, the absorption coefficient of 600 cm$^{-1}$ at 800 nm, the thickness of 80 nm) 205 was formed so that the absorption coefficient and the thickness thereof were the same as in Example 5, but the production conditions thereof were changed to those shown in Table 11. The photovoltaic element was prepared in the same manner as in Example 5, except for the above. This photovoltaic element will be called SC Comp Ex 5-2.

TABLE 11

| | |
|---|---|
| SiH₄ (source gas) | 30 sccm |
| SiF₄ (source gas) | 20 sccm |
| H₂ (dilution gas) | 1000 sccm |
| deposition time | 1000 sec |
| pressure | 800 mTorr |
| substrate temperature | 320° C. |
| MW power | 110 W |

Sections of the photovoltaic elements SC Ex 5-1, SC Comp Ex 5-1, and SC Comp Ex 5-2 were observed with a scanning electron microscope (SEM). At this time, both the first i-type microcrystal semiconductor layer 204 and second i-type microcrystal semiconductor layer 205 of SC Ex 5-1 demonstrated the columnar structure, while the first i-type microcrystal semiconductor layer 204 of SC Comp Ex 5-1 and the second i-type microcrystal semiconductor layer 205 of SC Comp Ex 5-2 demonstrated the grain structure.

The photovoltaic elements SC Ex 5-1, SC Comp Ex 5-1, and SC Comp Ex 5-2 showed the results of the measurement of the initial photoelectric conversion efficiency, the rate of the photoelectric conversion efficiency after the light degradation, the rate of the photoelectric conversion efficiency after the vibration degradation, the bending test, the twisting test, and the hail test, as indicated in Table 12. The photoelectric conversion efficiencies in Table 12 are relative values with respect to that of SC Ex 5-1 being defined as 1.00.

From the above results, it was verified that SC Ex 5-1 was superior to the comparative examples.

EXAMPLE 6

The photovoltaic element was produced in the structure of FIG. 2 in the similar fashion to that of Example 3, except that the photoelectric conversion layers were deposited under the conditions of Table 13.

In this example, the first deposited conduction type semiconductor layer 203 was an n-type semiconductor layer (μc-Si:H, 20 nm).

The i-type layer 208 was three units 207 successively deposited, each unit 207 being a set of the first i-type microcrystal semiconductor layer (μc-Si:H, the absorption coefficient of 300 cm$^{-1}$ at 800 nm, the thickness of 300 nm) 204 and the second i-type microcrystal semiconductor layer (μc-Si:H:F, the absorption coefficient of 600 cm$^{-1}$ at 800 nm, the thickness of 200 nm) 205.

Further, the second deposited conduction type semiconductor layer 206 was a p-type semiconductor layer (μc-Si:H, 20 nm). After that, the transparent electrode and collector electrode were deposited in the similar fashion to those in Example 3.

The average grain sizes of the first microcrystal semiconductor layer 204 and the second microcrystal semiconductor layer 205 were 40 nm and 80 nm, respectively. The average grain sizes were obtained from images with a transmission electron microscope. This photovoltaic element will be called SC Ex 6-1.

TABLE 13

| p-type layer (second conduction type semiconductor layer 206) | |
|---|---|
| SiH₄ | 2 sccm |
| H₂ | 300 sccm |
| BF₃/H₂ | 15 sccm |
| pressure | 1 Torr |
| substrate temperature | 200° C. |
| RF power | 50 W |
| i-type layer 208 | |
| first i-type μc semiconductor layer 204 | |
| SiH₄ (source gas) | 55 sccm |
| H₂ (dilution gas) | 750 sccm |
| deposition time | 600 sec |
| pressure | 40 mTorr |
| substrate temperature | 220° C. |
| MW power | 20 W |

TABLE 12

| Sample No. | Initial conversion efficiency | After optical degradation | After vibration degradation | Bending test vision | Bending test conversion efficiency | Twisting test vision | Twisting test conversion efficiency | Hail test vision | Hail test conversion efficiency | Overall rank |
|---|---|---|---|---|---|---|---|---|---|---|
| SC Ex 5-1 | 1.00 | 1.00 | 1.00 | no peel | 1.00 | no peel | 1.00 | no peel | 1.00 | ◯ |
| SC Comp Ex 5-1 | 0.95 | 0.95 | 0.97 | no peel | 0.98 | no peel | 0.97 | no peel | 0.92 | X |
| SC Comp Ex 5-2 | 096 | 0.94 | 0.97 | no peel | 0.97 | no peel | 0.98 | no peel | 0.93 | X |

TABLE 13-continued

| second i-type μc semiconductor layer 205 | |
|---|---|
| SiH₄ (source gas) | 30 sccm |
| SiF₄ (source gas) | 20 sccm |
| H₂ (dilution gas) | 1900 sccm |
| deposition time | 1000 sec |
| pressure | 40 mTorr |
| substrate temperature | 220° C. |
| MW power | 32 W |
| n-type layer (first conduction type semiconductor layer 203) | |
| SiH₄ | 3 sccm |
| H₂ | 400 sccm |
| PF₅/H₂ | 10 sccm |
| pressure | 1 Torr |
| substrate temperature | 300° C. |
| RF power | 50 W |

Comparative Example 6-1

The first i-type microcrystal semiconductor layer (μc-Si:H, the absorption coefficient of 300 cm⁻¹ at 800 nm, the thickness of 300 nm) 204 was formed so that the absorption coefficient and the thickness thereof were the same as in Example 6, but the production conditions thereof were changed to those shown in Table 14. The photovoltaic element was prepared in the same manner as in Example 6, except for the above.

TABLE 14

| SiH₄ (source gas) | 55 sccm |
|---|---|
| H₂ (dilution gas) | 750 sccm |
| deposition time | 1800 sec |
| pressure | 40 mTorr |
| substrate temperature | 220° C. |
| MW power | 10 W |

The average grain size of this film was 80 nm. This photovoltaic element will be called SC Comp Ex 6-1.

Comparative Example 6-2

The second i-type microcrystal semiconductor layer (μc-Si:H:F, the absorption coefficient of 600 cm⁻¹ at 800 nm, the thickness of 200 nm) 205 was formed so that the absorption coefficient and the thickness thereof were the same as in Example 6, but the production conditions thereof were changed to those shown in Table 15. The photovoltaic element was prepared in the same manner as in Example 6, except for the above.

TABLE 15

| SiH₄ (source gas) | 30 sccm |
|---|---|
| SiF₄ (source gas) | 10 sccm |
| H₂ (dilution gas) | 1500 sccm |
| deposition time | 1400 sec |
| pressure | 40 mTorr |
| substrate temperature | 220° C. |
| MW power | 32 W |

The average grain size of this film was 40 nm. This photovoltaic element will be called SC Comp Ex 6-2.

The photovoltaic elements SC Ex 6-1, SC Comp Ex 6-1, and SC Comp Ex 6-2 showed the results of the measurement of the initial photoelectric conversion efficiency, the rate of the photoelectric conversion efficiency after the light degradation, the rate of the photoelectric conversion efficiency after the vibration degradation, the bending test, the twisting test, and the hail test, as indicated in Table 16. The photoelectric conversion efficiencies in Table 16 are relative values with respect to that of SC Ex 6-1 being defined as 1.00.

TABLE 16

| Sample No. | Initial conversion efficiency | After optical degradation | After vibration degradation | Bending test | | Twisting test | | Hail test | | Overall rank |
|---|---|---|---|---|---|---|---|---|---|---|
| | | | | vision | conversion efficiency | vision | conversion efficiency | vision | conversion efficiency | |
| SC Ex 6-1 | 1.00 | 1.00 | 1.00 | no peel | 1.00 | no peel | 1.00 | no peel | 1.00 | o |
| SC Comp Ex 6-1 | 0.90 | 0.95 | 0.95 | no peel | 0.95 | no peel | 0.95 | no peel | 0.97 | x |
| SC Comp Ex 6-2 | 0.90 | 0.95 | 0.96 | no peel | 0.96 | no peel | 0.96 | no peel | 0.97 | x |

From the above results, it was verified that SC Ex 6-1 was superior to the comparative examples.

EXAMPLE 7

The photovoltaic element was produced in the structure of FIG. 2 in the similar fashion to that of Example 3, except that the photoelectric conversion layers were deposited under the conditions of Table 17.

In this example, the first deposited conduction type semiconductor layer 203 was an n-type semiconductor layer (μc-Si:H, 20 nm).

The i-type layer 208 was three successively deposited units 207, each a set of the first i-type microcrystal semiconductor layer (μc-Si:H, the absorption coefficient of 300 cm⁻¹ at 800 nm, the thickness of 300 nm) 204, and the second i-type microcrystal semiconductor layer (μc-Si:H:F, the absorption coefficient of 600 cm⁻¹ at 800 nm, the thickness of 200 nm) 205.

Further, the second deposited conduction type semiconductor layer 206 was a p-type semiconductor layer (μc-Si:H, 20 nm). After that, the transparent electrode and collector electrode were deposited in the similar fashion to those in Example 3.

The crystal volume percentages of the first microcrystal semiconductor layer 204 and the second microcrystal semiconductor layer 205 were 50% and 80%, respectively. The crystal volume percentages were obtained from intensities of a sharp signal from crystals near 520 cm$^{-1}$ and a broad signal from amorphous part near 480 cm$^{-1}$ in Raman scattering spectra. This photovoltaic element will be called SC Ex 7-1.

TABLE 17 p-type layer (second conduction type semiconductor layer 206)

| | |
|---|---|
| SiH$_4$ | 2 sccm |
| H$_2$ | 300 sccm |
| BF$_3$/H$_2$ | 15 sccm |
| pressure | 1 Torr |
| substrate temperature | 200° C. |
| RF power | 50 W | i-type layer 208 first i-type μc semiconductor layer 204

| | |
|---|---|
| SiH$_4$ (source gas) | 55 sccm |
| H$_2$ (dilution gas) | 700 sccm |
| deposition time | 600 sec |
| pressure | 40 mTorr |
| substrate temperature | 250° C. |
| MW power | 20 W | second i-type μc semiconductor layer 205

| | |
|---|---|
| SiH$_4$ (source gas) | 30 sccm |
| SiF$_4$ (source gas) | 20 sccm |
| H$_2$ (dilution gas) | 1800 sccm |
| deposition time | 1000 sec |
| pressure | 40 mTorr |
| substrate temperature | 250° C. |
| MW power | 20 W | n-type layer (first conduction type semiconductor layer 203)

| | |
|---|---|
| SiH$_4$ | 3 sccm |
| H$_2$ | 400 sccm |
| PF$_5$/H$_2$ | 10 sccm |
| pressure | 1 Torr |
| substrate temperature | 300° C. |
| RF power | 50 W |

Comparative Example 7-1

The first i-type microcrystal semiconductor layer (μc-Si:H, the absorption coefficient of 300 cm$^{-1}$ at 800 nm, the thickness of 300 nm) 204 was formed so that the absorption coefficient and the thickness thereof were the same as in Example 7, but the production conditions thereof were changed to those shown in Table 18. The photovoltaic element was prepared in the same manner as in Example 7, except for the above. The crystal volume percentage of this film was 80%. This photovoltaic element will be called SC Comp Ex 7-1.

TABLE 18

| | |
|---|---|
| SiH$_4$ (source gas) | 55 sccm |
| H$_2$ (dilution gas) | 600 sccm |
| deposition time | 1200 sec |
| pressure | 40 mTorr |
| substrate temperature | 270° C. |
| MW power | 25 W |

Comparative Example 7-2

The second i-type microcrystal semiconductor layer (μc-Si:H:F, the absorption coefficient of 600 cm$^{-1}$ at 800 nm, the thickness of 200 nm) 205 was formed so that the absorption coefficient and the thickness thereof were the same as in Example 7, but the production conditions thereof were changed to those shown in Table 19. The photovoltaic element was prepared in the same manner as in Example 7, except for the above. The crystal volume percentage of this film was 50%. This photovoltaic element will be called SC Comp Ex 7-2.

TABLE 19

| | |
|---|---|
| SiH$_4$ (source gas) | 30 sccm |
| SiF$_4$ (source gas) | 10 sccm |
| H$_2$ (dilution gas) | 1000 sccm |
| deposition time | 1000 sec |
| pressure | 40 mTorr |
| substrate temperature | 230° C. |
| MW power | 20 W |

The photovoltaic elements SC Ex 7-1, SC Comp Ex 7-1, and SC Comp Ex 7-2 showed the results of the measurement of the initial photoelectric conversion efficiency, the rate of the photoelectric conversion efficiency after the light degradation, the rate of the photoelectric conversion efficiency after the vibration degradation, the bending test, the twisting test, and the hail test, as indicated in Table 20. The photoelectric conversion efficiencies in Table 20 are relative values with respect to that of SC Ex 7-1 being defined as 1.00.

TABLE 20

| Sample No. | Initial conversion efficiency | After optical degradation | After vibration degradation | Bending test vision | Bending test conversion efficiency | Twisting test vision | Twisting test conversion efficiency | Hail test vision | Hail test conversion efficiency | Overall rank |
|---|---|---|---|---|---|---|---|---|---|---|
| SC Ex 7-1 | 1.00 | 1.00 | 1.00 | no peel | 1.00 | no peel | 1.00 | no peel | 1.00 | ○ |
| SC Comp Ex 7-1 | 0.93 | 0.95 | 0.92 | no peel | 0.97 | peel observed | 0.96 | peel observed | 0.97 | x |
| SC Comp Ex 7-2 | 0.92 | 0.95 | 0.93 | no peel | 0.98 | no peel | 0.95 | no peel | 0.95 | x | coefficient and the thickness thereof were the same as in Example 7, but the production conditions thereof were changed to those shown in Table 18. The photovoltaic element was prepared in the same manner as in Example 7, except for the above. The crystal volume percentage of this film was 80%. This photovoltaic element will be called SC Comp Ex 7-1.

From the above results, it was verified that SC Ex 7-1 was superior to the comparative examples.

EXAMPLE 8

The photovoltaic element was produced in the structure of FIG. 2 in the similar fashion to that of Example 3, except that the photoelectric conversion layers were deposited under the conditions of Table 21.

In this example, the first deposited conduction type semiconductor layer 203 was an n-type semiconductor layer (µc-Si:H, 20 nm).

The i-type layer 208 was three successively deposited units 207, each being a set of the first i-type microcrystal semiconductor layer (µc-Si:H, the absorption coefficient of 300 cm$^{-1}$ at 800 nm, the thickness of 300 nm) 204 and the second i-type microcrystal semiconductor layer (µc-Si:H:F, the absorption coefficient of 600 cm$^{-1}$ at 800 nm, the thickness of 200 nm) 205.

Further, the second deposited conduction type semiconductor layer 206 was a p-type semiconductor layer (µc-Si:H, 20 nm).

The first i-type microcrystal semiconductor layer 204 and the second i-type microcrystal semiconductor layer 205 were deposited with the thickness of 1 µm on an i-type silicon single crystal (the relative resistance>1000 Ω cm) and the hydrogen contents thereof were obtained from absorption near 2000 cm$^{-1}$ by FT-IR (Fourier transform infrared absorption spectroscopy). Their hydrogen contents were 7 atom % and 5 atom %, respectively. This photovoltaic element will be called SC Ex 8-1.

TABLE 21 p-type layer (second conduction type semiconductor layer 206)

| | |
|---|---|
| SiH$_4$ | 2 sccm |
| H$_2$ | 300 sccm |
| BF$_3$/H$_2$ | 15 sccm |
| pressure | 1 Torr |
| substrate temperature | 200 C. |
| RF power | 50 W | i-type layer 208 first i-type µc semiconductor layer 204

| | |
|---|---|
| SiH$_4$ (source gas) | 55 sccm |
| H$_2$ (dilution gas) | 700 sccm |
| deposition time | 600 sec |
| pressure | 40 mTorr |
| substrate temperature | 250° C. |
| MW power | 20 W | second i-type µc semiconductor layer 205

| | |
|---|---|
| SiH$_4$ (source gas) | 30 sccm |
| SiF$_4$ (source gas) | 20 sccm |
| H$_2$ (dilution gas) | 1800 sccm |
| deposition time | 1000 sec |
| substrate temperature | 250° C. |
| MW power | 20 W | n-type layer (first conduction type semiconductor layer 203)

| | |
|---|---|
| SiH$_4$ | 3 sccm |
| H$_2$ | 400 sccm |
| PF$_5$/H$_2$ | 10 sccm |
| pressure | 1 Torr |
| substrate temperature | 300° C. |
| RF power | 50 W |

Comparative Example 8-1

The first i-type microcrystal semiconductor layer (µc-Si:H, the absorption coefficient of 300 cm$^{-1}$ at 800 nm, the thickness of 300 nm) 204 was formed so that the absorption coefficient and the thickness thereof were the same as in Example 8, but the production conditions thereof were changed to those shown in Table 22. The photovoltaic element was prepared in the same manner as in Example 8, except for the above. The hydrogen content of this film was 5 atom %. This photovoltaic element will be called SC Comp Ex 8-1.

TABLE 22

| | |
|---|---|
| SiH$_4$ (source gas) | 55 sccm |
| H$_2$ (dilution gas) | 700 sccm |
| deposition time | 900 sec |
| pressure | 40 mTorr |
| substrate temperature | 280° C. |
| MW power | 20 W |

Comparative Example 8-2

The second i-type microcrystal semiconductor layer (µc-Si:H:F, the absorption coefficient of 600 cm$^{-1}$ at 800 nm, the thickness of 200 nm) 205 was formed so that the absorption coefficient and the thickness thereof were the same as in Example 8, but the production conditions thereof were changed to those shown in Table 23. The photovoltaic element was prepared in the same manner as in Example 8, except for the above. The hydrogen content of this film was 7 atom %. This photovoltaic element will be called SC Comp Ex 8-2.

TABLE 23

| | |
|---|---|
| SiH$_4$ (source gas) | 30 sccm |
| SiF$_4$ (source gas) | 20 sccm |
| H$_2$ (dilution gas) | 1800 sccm |
| deposition time | 1600 sec |
| substrate temperature | 200° C. |
| MW power | 20 W |

The photovoltaic elements SC Ex 8-1, SC Comp Ex 8-1, and SC Comp Ex 8-2 showed the results of the measurement of the initial photoelectric conversion efficiency, the rate of the photoelectric conversion efficiency after the light degradation, the rate of the photoelectric conversion efficiency after the vibration degradation, the bending test, the twisting test, and the hail test, as indicated in Table 24. The photoelectric conversion efficiencies in Table 24 are relative values with respect to that of SC Ex 8-1 being defined as 1.00.

TABLE 24

| Sample No. | Initial conversion efficiency | After optical degradation | After vibration degradation | Bending test vision | Bending test conversion efficiency | Twisting test vision | Twisting test conversion efficiency | Hail test vision | Hail test conversion efficiency | Overall rank |
|---|---|---|---|---|---|---|---|---|---|---|
| SC Ex 8-1 | 1.00 | 1.00 | 1.00 | no peel | 1.00 | no peel | 1.00 | no peel | 1.00 | ○ |
| SC | 0.95 | 0.96 | 0.95 | no | 0.95 | no peel | 0.93 | no | 0.95 | x |

TABLE 24-continued

| Sample No. | Initial conversion efficiency | After optical degradation | After vibration degradation | Bending test vision | Bending test conversion efficiency | Twisting test vision | Twisting test conversion efficiency | Hail test vision | Hail test conversion efficiency | Overall rank |
|---|---|---|---|---|---|---|---|---|---|---|
| Comp Ex 8-1 |  |  |  | peel |  |  |  | peel |  |  |
| SC Comp Ex 8-2 | 0.95 | 0.93 | 0.91 | no peel | 0.95 | no peel | 0.95 | no peel | 0.96 | x |

From the above results, it was verified that SC Ex 8-1 was superior to the comparative examples.

EXAMPLE 9

Figure 6:
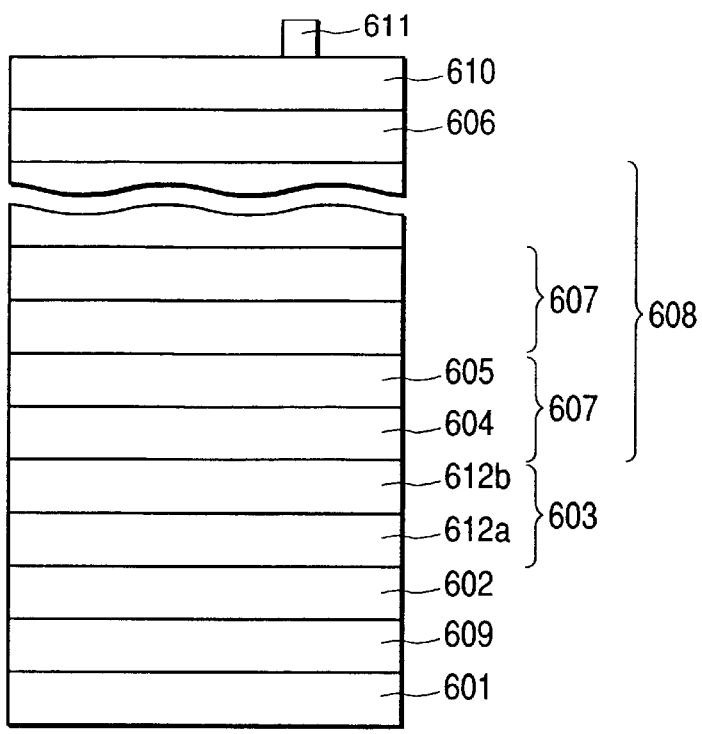
FIG. 6 is a schematic, sectional view to show another embodiment of the photovoltaic element of the present invention.

The photovoltaic element was produced in the structure of FIG. 6 in the same manner as in Example 3 except that the substrate 601 used was a stainless steel substrate (SUS 304) having the thickness of 0.2 mm and the size of 50 mm×50 mm, that the back reflecting layer (Ag, 450 nm) 609 and the transparent conductive layer (ZnO, 1 μm) 602 were deposited using the deposition apparatus shown in FIG. 4, and that the photoelectric conversion layers were deposited under the conditions of Table 25 using the deposition apparatus shown in FIG. 5.

In this example, the first conduction type semiconductor layer 603 was composed of an n-type semiconductor layer (μc-SiC:H, 20 nm) 612*a* and an n-type semiconductor layer (μc-Si:H, 20 nm) 612*b* successively deposited.

The i-type layer 608 was three successively stacked units 607, each being a set of the first i-type microcrystal semiconductor layer (μc-Si:H, the absorption coefficient of 300 cm$^{-1}$ at 800 nm, the thickness of 200 nm) 604 and the second i-type microcrystal semiconductor layer (μc-Si:H, the absorption coefficient of 900 cm$^{-1}$ at 800 nm, the thickness of 300 nm) 605.

Further, the second conduction type semiconductor layer 606 deposited was a p-type semiconductor layer (μc-Si:H, 20 nm). Numeral 610 denotes the transparent electrode and 611 the collector electrode. This photovoltaic element will be called SC Ex 9-1.

TABLE 25

| p-type layer (second conduction type semiconductor layer 606) | |
|---|---|
| SiH$_4$ | 2 sccm |
| H$_2$ | 300 sccm |
| BF$_3$/H$_2$ | 15 sccm |
| pressure | 1 Torr |
| substrate temperature | 200° C. |
| RF power | 50 W |
| i-type layer 608 | |
| first i-type μc semiconductor layer 604 | |
| SiH$_4$ (source gas) | 55 sccm |
| H$_2$ (dilution gas) | 700 sccm |
| deposition time | 400 sec |
| pressure | 40 mTorr |
| substrate temperature | 250° C. |
| MW power | 20 W |
| second i-type μc semiconductor layer 605 | |
| SiH$_4$ (source gas) | 50 sccm |

TABLE 25-continued

| | |
|---|---|
| H$_2$ (dilution gas) | 1200 sccm |
| deposition time | 900 sec |
| pressure | 40 mTorr |
| substrate temperature | 250° C. |
| MW power | 20 W |
| n-type layer (first conduction type semiconductor layer 603) | |
| n-type semiconductor layer 612b | |
| SiH$_4$ | 3 sccm |
| H$_2$ | 400 sccm |
| PF$_5$/H$_2$ | 10 sccm |
| pressure | 1 Torr |
| substrate temperature | 300° C. |
| RF power | 50 W |
| n-type semiconductor layer 612a | |
| SiH$_4$ | 3 sccm |
| CH$_4$ | 0.5 sccm |
| H$_2$ | 400 sccm |
| PF$_5$/H$_2$ | 10 sccm |
| pressure | 1 Torr |
| substrate temperature | 300° C. |
| RF power | 50 W |

Comparative Example 9-1

The photovoltaic element was prepared in the same manner as in Example 9, except that the first conduction type semiconductor layer 603 was (μc-Si:H, 20 nm). This photovoltaic element will be called SC Comp Ex 9-1.

The photovoltaic elements SC Ex 9-1 and SC Comp Ex 9-1 showed the results of the measurement of the initial photoelectric conversion efficiency, the rate of the photoelectric conversion efficiency after the light degradation, and the rate of the photoelectric conversion efficiency after the vibration degradation, as indicated in Table 26. The photoelectric conversion efficiencies in Table 26 are relative values with respect to that of SC Ex 9-1 being defined as 1.00.

TABLE 26

| Sample No. | Initial conversion efficiency | After optical degradation | After vibration degradation | Overall rank |
|---|---|---|---|---|
| SC Ex 9-1 | 1.00 | 1.00 | 1.00 | ○ |
| SC Comp Ex 9-1 | 0.95 | 0.95 | 0.95 | x |

From the above results, it was verified that SC Ex 9-1 was superior to the comparative example.

EXAMPLE 10

Figure 7:
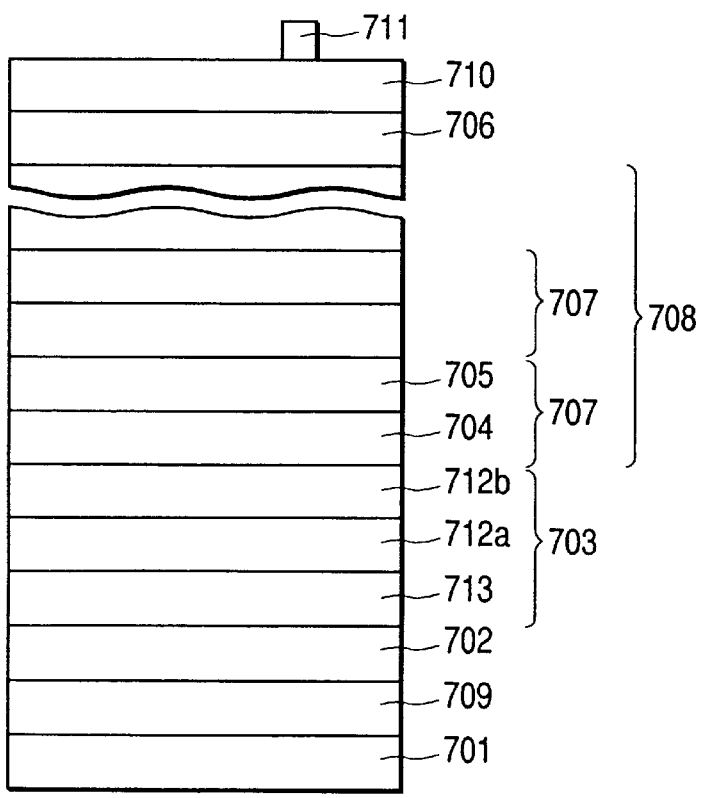
FIG. 7 is a schematic, sectional view to show another embodiment of the photovoltaic element of the present invention.

The photovoltaic element was produced in the structure of FIG. 7 in the same manner as in Example 3, except that the substrate 701 used was the stainless steel substrate (SUS 304) having the thickness of 0.2 mm and the size of 50 mm×50 mm, that the back reflecting layer (Ag, 50 nm) 709 and the transparent conductive layer (ZnO, 1 µm) 702 were deposited using the deposition apparatus shown in FIG. 4, and that the photoelectric conversion layers were deposited under the conditions of Table 27 using the deposition apparatus shown in FIG. 5.

In this example, the first conduction type semiconductor layer 703 was composed of an n-type semiconductor layer (µc-SiC:H, 20 nm) 713, an n-type semiconductor layer (µc-SiC:H, 20 nm) 712a, and an n-type semiconductor layer (µc-Si:H, 20 nm) 712b successively deposited.

The i-type layer 708 was three successively stacked units 707, each being a set of the first i-type microcrystal semiconductor layer (µc-Si:H, the absorption coefficient of 300 cm$^{-1}$ at 800 nm, the thickness of 200 nm) 704 and the second i-type microcrystal semiconductor layer (µc-Si:H, the absorption coefficient of 900 cm$^{-1}$ at 800 nm, the thickness of 300 nm) 705.

Further, the second conduction type semiconductor layer 706 deposited was a p-type semiconductor layer (µc-Si:H, 20 nm). Numeral 710 denotes the transparent electrode and 711 the collector electrode. This photovoltaic element will be called SC Ex 10-1.

TABLE 27

| p-type layer (second conduction type semiconductor layer 706) | |
|---|---|
| SiH$_4$ | 2 sccm |
| H$_2$ | 300 sccm |
| BF$_3$/H$_2$ | 15 sccm |
| pressure | 1 Torr |
| substrate temperature | 200° C. |
| RF power | 50 W |
| i-type layer 708 | |
| first i-type µc semiconductor layer 704 | |
| SiH$_4$ (source gas) | 55 sccm |
| H$_2$ (dilution gas) | 700 sccm |
| deposition time | 400 sec |
| pressure | 40 mTorr |
| substrate temperature | 250° C. |
| MW power | 20 W |
| second i-type µc semiconductor layer 705 | |
| SiH$_4$ (source gas) | 50 sccm |
| H$_2$ (dilution gas) | 1200 sccm |
| deposition time | 900 sec |
| pressure | 40 mTorr |
| substrate temperature | 250° C. |
| MW power | 20 W |
| n-type layer (first conduction type semiconductor layer 703) | |
| n-type semiconductor layer 712b | |
| SiH$_4$ | 3 sccm |
| H$_2$ | 400 sccm |
| PF$_5$/H$_2$ | 10 sccm |
| pressure | 1 Torr |
| substrate temperature | 300° C. |
| RF power | 50 W |
| n-type semiconductor layer 712a | |
| SiH$_4$ | 3 sccm |
| CH$_4$ | 0.5 sccm |
| H$_2$ | 400 sccm |
| PF$_5$/H$_2$ | 10 sccm |
| pressure | 1 Torr |
| substrate temperature | 300° C. |
| RF power | 50 W |

TABLE 27-continued

| n-type semiconductor layer 713 | |
|---|---|
| SiH$_4$ | 3 sccm |
| CH$_4$ | 0.5 sccm |
| H$_2$ | 30 sccm |
| PF$_5$/H$_2$ | 1 sccm |
| pressure | 1 Torr |
| substrate temperature | 300° C. |
| RF power | 3 W |

Comparative Example 10-1

The photovoltaic element was produced in the same manner as in Example 10, except that the first conduction type semiconductor layer 703 was composed of an n-type semiconductor layer (µc-SiC:H, 20 nm) and an n-type semiconductor layer (µc-Si:H, 20 nm). This photovoltaic element will be called SC Comp Ex 10-1.

The photovoltaic elements SC Ex 10-1 and SC Comp Ex 10-1 showed the results of the measurement of the initial photoelectric conversion efficiency, the rate of the photoelectric conversion efficiency after the light degradation, and the rate of the photoelectric conversion efficiency after the vibration degradation as indicated in Table 28. The photoelectric conversion efficiencies in Table 28 are relative values with respect to that of SC Ex 10-1 being defined as 1.00.

TABLE 28

| Sample No. | Initial conversion efficiency | After optical degradation | After vibration degradation | Overall rank |
|---|---|---|---|---|
| SC Ex 10-1 | 1.00 | 1.00 | 1.00 | ○ |
| SC Comp Ex 10-1 | 0.92 | 0.96 | 0.96 | x |

From the above results, it was verified that SC Ex 10-1 was superior to the comparative example.

EXAMPLE 11

Figure 8:
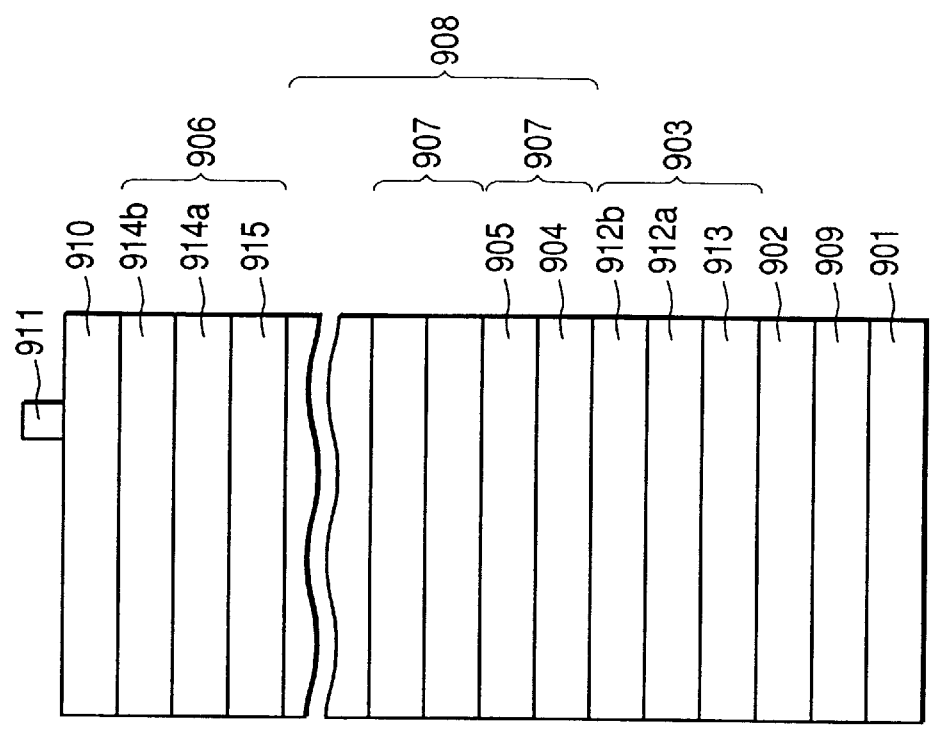
FIG. 8 is a schematic, sectional view to show another embodiment of the photovoltaic element of the present invention.

The photovoltaic element was produced in the structure of FIG. 8 in the same manner as in Example 3, except that the substrate 801 used was the stainless steel substrate (SUS 304) having the thickness of 0.2 mm and the size of 50 mm×50 mm, that the back reflecting layer (Ag, 450 nm) 809 and the transparent conductive layer (ZnO, 1 µm) 802 were deposited using the deposition apparatus shown in FIG. 4, and that the photoelectric conversion layers were deposited under the conditions of Table 29 using the deposition apparatus shown in FIG. 5.

In this example, the first conduction type semiconductor layer 803 was composed of an n-type semiconductor layer (a-SiC:H, 20 nm) 813, an n-type semiconductor layer (µc-SiC:H, 20 nm) 812a, and an n-type semiconductor layer (µc-Si:H, 20 nm) 812b successively deposited.

The i-type layer 808 was three successively stacked units 807, each being a set of the first i-type microcrystal semiconductor layer (µc-Si:H, the absorption coefficient of 300 cm$^{-1}$ at 800 nm, the thickness of 200 nm) 804 and the second i-type microcrystal semiconductor layer (µc-Si:H, the absorption coefficient of 900 cm$^{-1}$ at 800 nm, the thickness of 300 nm) 805.

Further, the second conduction type semiconductor layer 806 was composed of a p-type semiconductor layer (µc-

Si:H, 15 nm) 814a and a p-type semiconductor layer (μc-SiC:H, 10 nm) 814b successively deposited. Numeral 810 denotes the transparent electrode and 811 the collector electrode. This photovoltaic element will be called SC Ex 11-1.

TABLE 29 p-type layer (second conduction type semiconductor layer 806)

p-type semiconductor layer 814a

| | |
|---|---|
| $SiH_4$ | 2 sccm |
| $H_2$ | 300 sccm |
| $BF_3/H_2$ | 15 sccm |
| pressure | 1 Torr |
| substrate temperature | 200° C. |
| RF power | 50 W | p-type semiconductor layer 814b

| | |
|---|---|
| $SiH_4$ | 2 sccm |
| $CH_4$ | 0.4 sccm |
| $H_2$ | 300 sccm |
| $BF_3/H_2$ | 15 sccm |
| pressure | 1 Torr |
| substrate temperature | 200° C. |
| RF power | 50 W | i-type layer 808 first i-type μc semiconductor layer 804

| | |
|---|---|
| $SiH_4$ (source gas) | 55 sccm |
| $H_2$ (dilution gas) | 700 sccm |
| deposition time | 400 sec |
| pressure | 40 mTorr |
| substrate temperature | 250° C. |
| MW power | 20 W | second i-type μc semiconductor layer 805

| | |
|---|---|
| $SiH_4$ (source gas) | 50 sccm |
| $H_2$ (dilution gas) | 1200 sccm |
| deposition time | 900 sec |
| pressure | 40 mTorr |
| substrate temperature | 250° C. |
| MW power | 20 W | n-type layer (first conduction type semiconductor layer 803)

n-type semiconductor layer 812b

| | |
|---|---|
| $SiH_4$ | 3 sccm |
| $H_2$ | 400 sccm |
| $PF_5/H_2$ | 10 sccm |
| pressure | 1 Torr |
| substrate temperature | 300° C. |
| RF power | 50 W | n-type semiconductor layer 812a

| | |
|---|---|
| $SiH_4$ | 3 sccm |
| $CH_4$ | 0.5 sccm |
| $H_2$ | 400 sccm |
| $PF_5/H_2$ | 10 sccm |
| pressure | 1 Torr |
| substrate temperature | 300° C. |
| RF power | 50 W | n-type semiconductor layer 813

| | |
|---|---|
| $SiH_4$ | 3 sccm |
| $CH_4$ | 0.5 sccm |
| $H_2$ | 30 sccm |
| $PF_5/H_2$ | 1 sccm |
| pressure | 1 Torr |
| substrate temperature | 300° C. |
| RF power | 3 W |

Comparative Example 11-1

The photovoltaic element was prepared in the same manner as in Example 11, except that the second conduction type semiconductor layer 806 was (μc-Si:H, 20 nm). This photovoltaic element will be called SC Comp Ex 11-1.

The photovoltaic elements SC Ex 11-1 and SC Comp Ex 11-1 showed the results of the measurement of the initial photoelectric conversion efficiency, the rate of the photoelectric conversion efficiency after the light degradation, and the rate of the photoelectric conversion efficiency after the vibration degradation as indicated in Table 30. The photoelectric conversion efficiencies in Table 30 are relative values with respect to that of SC Ex 11-1 being defined as 1.00.

TABLE 30

| Sample No. | Initial conversion efficiency | After optical degradation | After vibration degradation | Overall rank |
|---|---|---|---|---|
| SC Ex 11-1 | 1.00 | 1.00 | 1.00 | ○ |
| SC Comp Ex 11-1 | 0.92 | 0.93 | 0.94 | x |

From the above results, it was verified that SC Ex 11-1 was superior to the comparative example.

EXAMPLE 12

Figure 9:
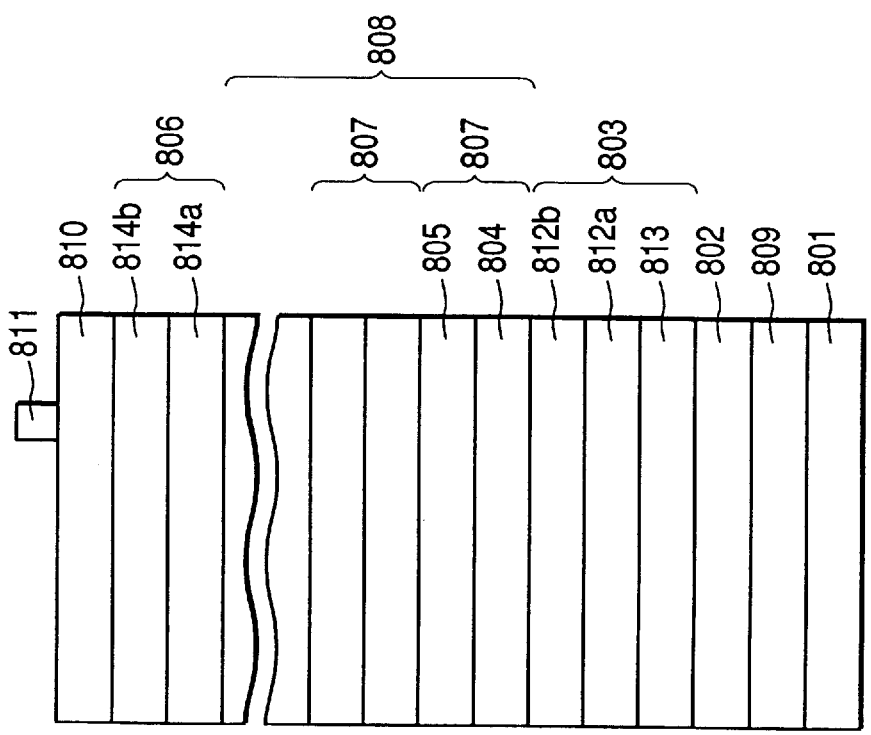
FIG. 9 is a schematic, sectional view to show another embodiment of the photovoltaic element of the present invention.

The photovoltaic element was produced in the structure of FIG. 9 in the same manner as in Example 3, except that the substrate 901 used was the stainless steel substrate (SUS 304) having the thickness of 0.2 mm and the size of 50 mm×50 mm, that the back reflecting layer (Ag, 450 nm) 909 and the transparent conductive layer (ZnO, 1 μm) 902 were deposited using the deposition apparatus shown in FIG. 4, and that the photoelectric conversion layers were deposited under the conditions of Table 31 using the deposition apparatus shown in FIG. 5.

In this example, the first conduction type semiconductor layer 903 was composed of an n-type semiconductor layer (a-SiC:H, 20 nm) 913, an n-type semiconductor layer (μc-SiC:H, 20 nm) 912a, and an n-type semiconductor layer (μc-Si:H, 20 nm) 912b successively deposited.

The i-type layer 908 was three successively stacked units 907, each being a set of the first i-type microcrystal semiconductor layer (μc-Si:H, the absorption coefficient of 300 $cm^{-1}$ at 800 nm, the thickness of 200 nm) 904 and the second i-type microcrystal semiconductor layer (μc-Si:H, the absorption coefficient of 900 $cm^{-1}$ at 800 nm, the thickness of 300 nm) 905.

Further, the second conduction type semiconductor layer 906 was composed of a p-type semiconductor layer (a-Si:H, 7.5 nm) 915, a p-type semiconductor layer (μc-Si:H, 7.5 nm) 914a, and a p-type semiconductor layer (μc-SiC:H, 10 nm) 914b successively deposited. Numeral 910 denotes the transparent electrode and 911 the collector electrode. This photovoltaic element will be called SC Ex 12-1.

TABLE 31 p-type layer (second conduction type semiconductor layer 906)

p-type semiconductor layer 915

| | |
|---|---|
| $SiH_4$ | 2 sccm |
| $H_2$ | 300 sccm |
| $BF_3/H_2$ | 15 sccm |
| pressure | 1 Torr |
| substrate temperature | 200° C. |
| RF power | 3 W | p-type semiconductor layer 914a

| | |
|---|---|
| $SiH_4$ | 2 sccm |

TABLE 31-continued

| | |
|---|---|
| H$_2$ | 300 sccm |
| BF$_3$/H$_2$ | 15 sccm |
| pressure | 1 Torr |
| substrate temperature | 200° C. |
| RF power | 50 W |
| p-type semiconductor layer 914b | |
| SiH$_4$ | 2 sccm |
| CH$_4$ | 0.4 sccm |
| H$_2$ | 30 sccm |
| BF$_3$/H$_2$ | 2 sccm |
| pressure | 0.5 Torr |
| substrate temperature | 200° C. |
| RF power | 50 W |
| i-type layer 908 | |
| first i-type μc semiconductor layer 904 | |
| SiH$_4$ (source gas) | 55 sccm |
| H$_2$ (dilution gas) | 700 sccm |
| deposition time | 400 sec |
| pressure | 40 mTorr |
| substrate temperature | 250° C. |
| MW power | 20 W |
| second i-type μc semiconductor layer 905 | |
| SiH$_4$ (source gas) | 50 sccm |
| H$_2$ (dilution gas) | 1200 sccm |
| deposition time | 900 sec |
| pressure | 40 mTorr |
| substrate temperature | 250° C. |
| MW power | 20 W |
| n-type layer (first conduction type semiconductor layer 903) | |
| n-type semiconductor layer 912b | |
| SiH$_4$ | 3 sccm |
| H$_2$ | 400 sccm |
| PF$_5$/H$_2$ | 10 sccm |
| pressure | 1 Torr |
| substrate temperature | 300° C. |
| RF power | 50 W |
| n-type semiconductor layer 912a | |
| SiH$_4$ | 3 sccm |
| CH$_4$ | 0.5 sccm |
| H$_2$ | 400 sccm |
| PF$_5$/H$_2$ | 10 sccm |
| pressure | 1 Torr |
| substrate temperature | 300° C. |
| RF power | 50 W |
| n-type semiconductor layer 913 | |
| SiH$_4$ | 3 sccm |
| CH$_4$ | 0.5 sccm |
| H$_2$ | 30 sccm |
| PF$_5$/H$_2$ | 1 sccm |
| pressure | 1 Torr |
| substrate temperature | 300° C. |
| RF power | 3 W |

Comparative Example 12-1

The photovoltaic element was produced in the same manner as in Example 12, except that the second conduction type semiconductor layer 906 was composed of a p-type semiconductor layer (μc-Si:H, 15 nm) and a p-type semiconductor layer (μc-SiC:H, 10 nm). This photovoltaic element will be called SC Comp Ex 12-1.

The photovoltaic elements SC Ex 12-1 and SC Comp Ex 12-1 showed the results of the measurement of the initial photoelectric conversion efficiency, the rate of the photoelectric conversion efficiency after the light degradation, and the rate of the photoelectric conversion efficiency after the vibration degradation, as indicated in Table 32. The photoelectric conversion efficiencies in Table 32 are relative values with respect to that of SC Ex 12-1 being defined as 1.00.

TABLE 32

| Sample No. | Initial conversion efficiency | After optical degradation | After vibration degradation | Overall rank |
|---|---|---|---|---|
| SC Ex 12-1 | 1.00 | 1.00 | 1.00 | ○ |
| SC Comp Ex 12-1 | 0.92 | 0.93 | 0.95 | x |

From the above results, it was verified that SC Ex 12-1 was superior to the comparative example.

EXAMPLE 13

Figure 10:
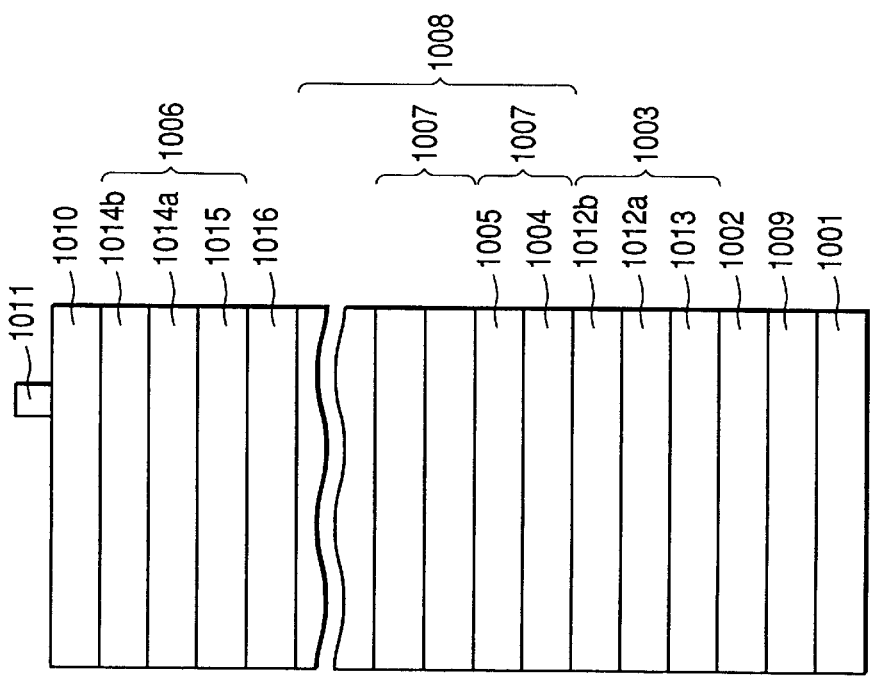
FIG. 10 is a schematic, sectional view to show another embodiment of the photovoltaic element of the present invention.

The photovoltaic element was produced in the structure of FIG. 10 in the same manner as in Example 3, except that the substrate 1001 used was the stainless steel substrate (SUS 304) having the thickness of 0.2 mm and the size of 50 mm×50 mm, that the back reflecting layer (Ag, 450 nm) 1009 and the transparent conductive layer (ZnO, 1 μm) 1002 were deposited using the deposition apparatus shown in FIG. 4, and that the photoelectric conversion layers were deposited under the conditions of Table 33 using the deposition apparatus shown in FIG. 5.

In this example, the first conduction type semiconductor layer 1003 was composed of an n-type semiconductor layer (a-SiC:H, 20 nm) 1013, an n-type semiconductor layer (μc-SiC:H, 20 nm) 1012a, and an n-type semiconductor layer (μc-Si:H, 20 nm) 1012b successively deposited.

The i-type layer 1008 was three successively stacked units 1007, each being a set of the first i-type microcrystal semiconductor layer (μc-Si:H, the absorption coefficient of 300 cm$^{-1}$ at 800 nm, the thickness of 200 nm) 1004 and the second i-type microcrystal semiconductor layer (μc-Si:H, the absorption coefficient of 900 cm$^{-1}$ at 800 nm, the thickness of 300 nm) 1005.

Further, after an i-type amorphous silicon base semiconductor layer (a-Si:H, 20 nm) 1016 was deposited on the i-type layer 1008, the second conduction type semiconductor layer 1006 was formed by successively depositing a p-type semiconductor layer (a-Si:H, 7.5 nm) 1015, a p-type semiconductor layer (μc-Si:H, 7.5 nm) 1014a, and a p-type semiconductor layer (μc-SiC:H, 10 nm) 1014b. Numeral 1010 denotes the transparent electrode and 1011 the collector electrode. This photovoltaic element will be called SC Ex 13-1.

TABLE 33

| | |
|---|---|
| p-type layer (second conduction type semiconductor layer 1006) | |
| p-type semiconductor layer 1015 | |
| SiH$_4$ | 2 sccm |
| H$_2$ | 300 sccm |
| BF$_3$/H$_2$ | 15 sccm |
| pressure | 1 Torr |
| substrate temperature | 200° C. |
| RF power | 3 W |
| p-type semiconductor layer 1014a | |
| SiH$_4$ | 2 sccm |
| H$_2$ | 300 sccm |
| BF$_3$/H$_2$ | 15 sccm |
| pressure | 1 Torr |
| substrate temperature | 200° C. |
| RF power | 50 W |

TABLE 33-continued p-type semiconductor layer 1014b

| | |
|---|---|
| $SiH_4$ | 2 sccm |
| $CH_4$ | 0.4 sccm |
| $H_2$ | 300 sccm |
| $BF_3/H_2$ | 2 sccm |
| pressure | 0.5 Torr |
| substrate temperature | 200° C. |
| RF power | 50 W | i-type amorphous Si base semiconductor layer 1016

| | |
|---|---|
| $SiH_4$ | 2 sccm |
| $H_2$ | 30 sccm |
| pressure | 0.5 Torr |
| substrate temperature | 200° C. |
| RF power | 3 W | i-type layer 1008 first i-type μc semiconductor layer 1004

| | |
|---|---|
| $SiH_4$ (source gas) | 55 sccm |
| $H_2$ (dilution gas) | 700 sccm |
| deposition time | 400 sec |
| pressure | 40 mTorr |
| substrate temperature | 250° C. |
| MW power | 20 W | second i-type μc semiconductor layer 1005

| | |
|---|---|
| $SiH_4$ (source gas) | 50 sccm |
| $H_2$ (dilution gas) | 1200 sccm |
| deposition time | 900 sec |
| pressure | 40 mTorr |
| substrate temperature | 250° C. |
| MW power | 20 W | n-type layer (first conduction type semiconductor layer 1003)

n-type semiconductor layer 1012b

| | |
|---|---|
| $SiH_4$ | 3 sccm |
| $H_2$ | 400 sccm |
| $PF_5/H_2$ | 10 sccm |
| pressure | 1 Torr |
| substrate temperature | 300° C. |
| RF power | 50 W | n-type semiconductor layer 1012a

| | |
|---|---|
| $SiH_4$ | 3 sccm |
| $CH_4$ | 0.5 sccm |
| $H_2$ | 400 sccm |
| $PF_5/H_2$ | 10 sccm |
| pressure | 1 Torr |
| substrate temperature | 300° C. |
| RF power | 50 W | n-type semiconductor layer 1013

| | |
|---|---|
| $SiH_4$ | 3 sccm |
| $CH_4$ | 0.5 sccm |
| $H_2$ | 30 sccm |
| $PF_5/H_2$ | 1 sccm |
| pressure | 1 Torr |
| substrate temperature | 300° C. |
| RF power | 3 W |

Comparative Example 13-1

The photovoltaic element was produced in the same manner as in Example 13, except that the i-type amorphous silicon base semiconductor layer (a-Si:H, 20 nm) 1016 was not deposited. This photovoltaic element will be called SC Comp Ex 13-1. The photovoltaic elements SC Ex 13-1 and SC Comp Ex 13-1 showed the results of the measurement of the initial photoelectric conversion efficiency, the rate of the photoelectric conversion efficiency after the light degradation, and the rate of the photoelectric conversion efficiency after the vibration degradation, as indicated in Table 34. The photoelectric conversion efficiencies in Table 34 are relative values with respect to that of SC Ex 13-1 being defined as 1.00.

TABLE 34

| Sample No. | Initial conversion efficiency | After optical degradation | After vibration degradation | Overall rank |
|---|---|---|---|---|
| SC Ex 13-1 | 1.00 | 1.00 | 1.00 | ○ |
| SC Comp Ex 13-1 | 0.90 | 0.95 | 0.95 | x |

From the above results, it was verified that SC Ex 13-1 was superior to the comparative example.

EXAMPLE 14

Figure 11:
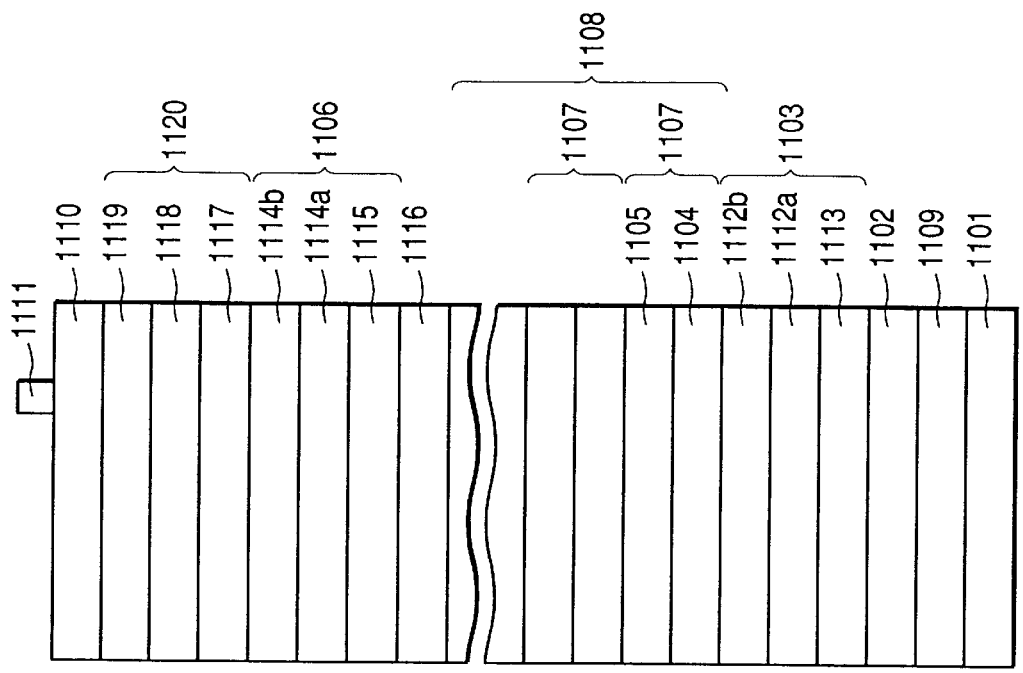
FIG. 11 is a schematic, sectional view to show another embodiment of the photovoltaic element of the present invention.

The photovoltaic element was produced in the structure of FIG. 11 in the same manner as in Example 3, except that the substrate 1101 used was the stainless steel substrate (SUS 304) having the thickness of 0.2 mm and the size of 50 mm×50 mm, that the back reflecting layer (Ag, 450 nm) 1109 and the transparent conductive layer (ZnO, 1 μm) 1102 were deposited using the deposition apparatus shown in FIG. 4, and that the photoelectric conversion layers incorporating an i-type layer of an amorphous silicon base semiconductor were deposited under the conditions of Table 35 and Table 36 using the deposition apparatus shown in FIG. 5.

In this example, the first conduction type semiconductor layer 1103 was composed of an n-type semiconductor layer (s-SiC:H, 10 nm) 1113, an n-type semiconductor layer (μc-SiC:H, 10 nm) 1112a, and an n-type semiconductor layer (μc-Si:H, 10 nm) 1112b successively deposited.

The i-type layer 1108 was three successively stacked units 1107, each being a set of the first i-type microcrystal semiconductor layer (μc-Si:H, the absorption coefficient of 300 cm$^{-1}$ at 800 nm, the thickness of 200 nm) 1104 and the second i-type microcrystal semiconductor layer (μc-Si:H, the absorption coefficient of 900 cm$^{-1}$ at 800 nm, the thickness of 300 nm) 1105.

Further, after an i-type amorphous silicon base semiconductor layer (a-Si:H, 50 nm) 1116 was deposited on the i-type layer, the second conduction type semiconductor layer 1106 was formed thereon by successively depositing a p-type semiconductor layer (a-Si:H, 7.5 nm) 1115, a p-type semiconductor layer (μc-Si:H, 7.5 nm) 1114a, and a p-type semiconductor layer (μc-SiC:H, 10 nm) 1114b.

A pin photovoltaic element 1120 was formed on the second conduction type semiconductor layer 1106 by successively depositing an n-type semiconductor layer (a-SiC:H, 15 nm) 1117, an i-type amorphous silicon base semiconductor layer (a-Si:H, 300 nm) 1118, and a p-type semiconductor layer (a-Si:H, 10 nm) 1119. Numeral 1110 denotes the transparent electrode and 1111 the collector electrode. This photovoltaic element will be called SC Ex 14-1.

TABLE 35 p-type layer (second conduction type semiconductor layer 1106)

p-type semiconductor layer 1115

| | |
|---|---|
| $SiH_4$ | 2 sccm |
| $H_2$ | 300 sccm |
| $BF_3/H_2$ | 15 sccm |
| pressure | 1 Torr |

TABLE 35-continued

| | | |
|---|---:|---|
| substrate temperature | 200° | C. |
| RF power | 3 | W |
| p-type semiconductor layer 1114a | | |
| $SiH_4$ | 2 | sccm |
| $H_2$ | 300 | sccm |
| $BF_3/H_2$ | 15 | sccm |
| pressure | 1 | Torr |
| substrate temperature | 200° | C. |
| RF power | 50 | W |
| p-type semiconductor layer 1114b | | |
| $SiH_4$ | 2 | sccm |
| $CH_4$ | 0.4 | sccm |
| $H_2$ | 30 | sccm |
| $BF_3/H_2$ | 2 | sccm |
| pressure | 0.5 | Torr |
| substrate temperature | 200° | C. |
| RF power | 50 | W |
| i-type amorphous Si base semiconductor layer 1116 | | |
| $SiH_4$ | 2 | sccm |
| $H_2$ | 30 | sccm |
| pressure | 0.5 | Torr |
| substrate temperature | 200° | C. |
| RF power | 3 | W |
| i-type layer 1108 | | |
| first i-type μc semiconductor layer 1104 | | |
| $SiH_4$ (source gas) | 55 | sccm |
| $H_2$ (dilution gas) | 700 | sccm |
| deposition time | 400 | sec |
| pressure | 40 | mTorr |
| substrate temperature | 250° | C. |
| MW power | 20 | W |
| second i-type μc semiconductor layer 1105 | | |
| $SiH_4$ (source gas) | 50 | sccm |
| $H_2$ (dilution gas) | 1200 | sccm |
| deposition time | 900 | sec |
| pressure | 40 | mTorr |
| substrate temperature | 250° | C. |
| MW power | 20 | W |
| n-type layer (first conduction type semiconductor layer 1103) | | |
| n-type semiconductor layer 1112b | | |
| $SiH_4$ | 3 | sccm |
| $H_2$ | 400 | sccm |
| $PF_5/H_2$ | 10 | sccm |
| pressure | 1 | Torr |
| substrate temperature | 300° | C. |
| RF power | 50 | W |
| n-type semiconductor layer 1112a | | |
| $SiH_4$ | 3 | sccm |
| $CH_4$ | 0.5 | sccm |
| $H_2$ | 400 | sccm |
| $PF_5/H_2$ | 10 | sccm |
| pressure | 1 | Torr |
| substrate temperature | 300° | C. |
| RF power | 50 | W |
| n-type semiconductor layer 1113 | | |
| $SiH_4$ | 3 | sccm |
| $CH_4$ | 0.5 | sccm |
| $H_2$ | 30 | sccm |
| $PF_5/H_2$ | 1 | sccm |
| pressure | 1 | Torr |
| substrate temperature | 300° | C. |
| RF power | 3 | W |

TABLE 36

| | | |
|---|---:|---|
| pin photovoltaic element 1120 | | |
| p-type semiconductor layer 1119 | | |
| $SiH_4$ | 2 | sccm |
| $H_2$ | 300 | sccm |
| $BF_3/H_2$ | 15 | sccm |
| pressure | 1 | Torr |
| substrate temperature | 150° | C. |
| RF power | 3 | W |
| i-type amorphous Si base semiconductor layer 1118 | | |
| $SiH_4$ | 2 | sccm |
| $H_2$ | 30 | sccm |
| pressure | 0.5 | Torr |
| substrate temperature | 150° | C. |
| RF power | 3 | W |
| n-type semiconductor layer 1117 | | |
| $SiH_4$ | 3 | sccm |
| $CH_4$ | 0.5 | sccm |
| $H_2$ | 30 | sccm |
| $PF_5/H_2$ | 1 | sccm |
| pressure | 1 | Torr |
| substrate temperature | 300° | C. |
| RF power | 3 | W |

Comparative Example 14-1

The photovoltaic element was prepared in the same manner as in Example 14, except that the i-type layer 1108 was deposited in the thickness of 1.5 μm only under the conditions of the first i-type microcrystal semiconductor layer (μc-Si:H, the absorption coefficient of 300 cm$^{-1}$ at 800 nm). This photovoltaic element will be called SC Comp Ex 14-1.

Comparative Example 14-2

The photovoltaic element was prepared in the same manner as in Example 14, except that the i-type layer 1108 was deposited in the thickness of 1.5 μm only under the conditions of the second i-type microcrystal semiconductor layer (μc-Si:H, the absorption coefficient of 900 cm$^{-1}$ at 800 nm). This photovoltaic element will be called SC Comp Ex 14-2.

The photovoltaic elements SC Ex 14-1, SC Comp Ex 14-1, and SC Comp Ex 14-2 showed the results of the measurement of the initial photoelectric conversion efficiency, the rate of the photoelectric conversion efficiency after the light degradation, the rate of the photoelectric conversion efficiency after the vibration degradation, the bending test, the twisting test, and the hail test as indicated in Table 37. The photoelectric conversion efficiencies in Table 37 are relative values with respect to that of SC Ex 14-1 being defined as 1.00.

TABLE 37

| Sample No. | Initial conversion efficiency | After optical degradation | After vibration degradation | Bending test | | Twisting test | | Hail test | | Overall rank |
|---|---|---|---|---|---|---|---|---|---|---|
| | | | | vision | conversion efficiency | vision | conversion efficiency | vision | conversion efficiency | |
| SC Ex 14-1 | 1.00 | 1.00 | 1.00 | no peel | 1.00 | no peel | 1.00 | no peel | 1.00 | ○ |
| SC Comp Ex 14-1 | 0.95 | 0.93 | 0.96 | peel observed | 0.85 | peel observed | 0.80 | no peel | 0.91 | x |
| SC Comp Ex 14-2 | 0.90 | 0.92 | 0.91 | peel observed | 0.97 | peel observed | 0.86 | peel observed | 0.89 | x |

From the above results, it was verified that SC Ex 14-1 was superior to the comparative examples.

EXAMPLE 15

Figure 12:
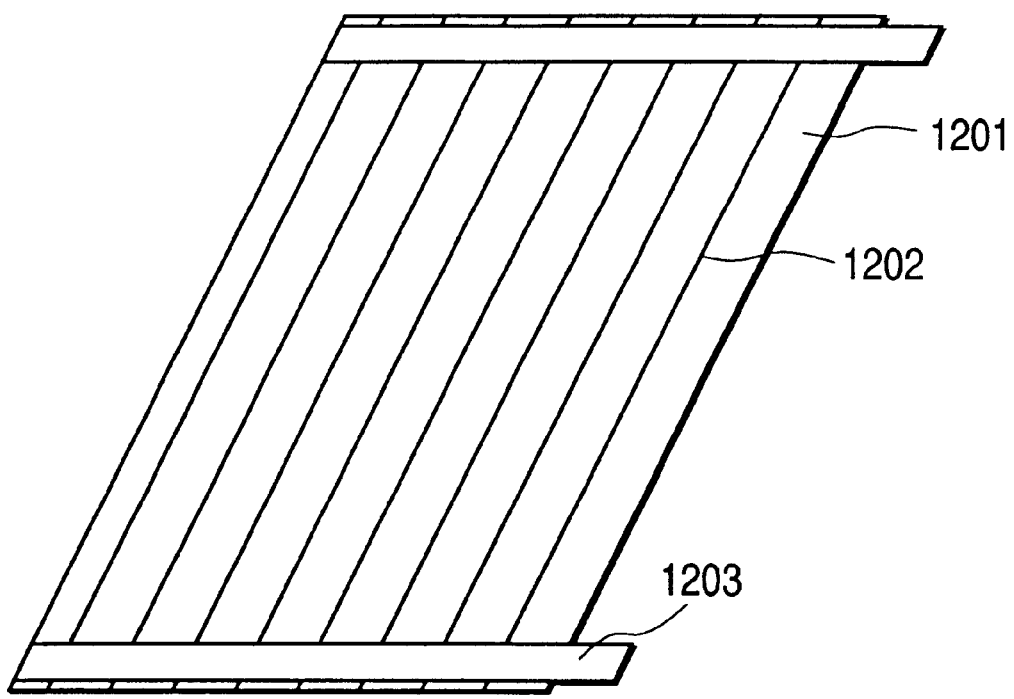
FIG. 12 is a schematic, perspective view to show an example of formation of grid electrode in the photovoltaic element of the present invention.

The collector electrode 1202 and busbars 1203 were attached, as shown in FIG. 12, to each of the photovoltaic elements produced in the structure of FIG. 11 in Example 14, and the four photovoltaic elements 1201 were connected in series while a bypass diode was connected in parallel to each photovoltaic element. Then stacked on a Galvalume sheet 1.0 mm thick were EVA, nylon resin, EVA, nonwoven glass fabric, the photovoltaic elements connected in series, nonwoven glass fabric, EVA, nonwoven glass fabric, EVA, nonwoven glass fabric, and fluororesin. Then they were heated to undergo vacuum sealing (lamination).

The solar cell module thus produced was bent to obtain a building material. This solar cell module will be called SC Ex 15-1.

Comparative Example 15-1

The solar cell module was produced in the same manner as in Example 15, except that the i-type layer 1108 was deposited in the thickness of 1.5 μm only under the conditions of the first i-type microcrystal semiconductor layer (μc-Si:H, the absorption coefficient of 300 cm$^{-1}$ at 800 nm). This solar cell module will be called SC Comp Ex 15-1. The following tests were carried out.

First, the solar cell module was subjected to the "temperature and humidity cycle test" pursuant to JIS C8917A-2 section for crystalline solar cells. As in FIG. 2 of the annex, one cycle was composed of a high temperature circumstance (the temperature 85° C., the humidity 85%, 2.5 hours) and a low temperature circumstance (the temperature −20° C., 1 hour), and ten cycles were carried out.

An outdoor exposure test was also conducted. The solar cell module was placed outdoors and was evaluated after 12-month exposure and after 24-month exposure. The evaluation was performed by measuring the efficiency and visually observing the appearance.

From the results of the temperature-humidity cycle test, SC Comp Ex 15-1 demonstrated decrease of the efficiency, but SC Ex 15-1 showed no decrease.

From the results of the outdoor exposure test, bubble-like part was observed in SC Comp Ex 15-1 and it was caused by delamination. There was no change in the appearance of SC Ex 15-1 at all. SC Ex 15-1 was superior in the decrease of efficiency.

EXAMPLE 16

The collector electrode 1202 and busbars 1203 were attached, as illustrated in FIG. 12, to each of the photovoltaic elements prepared in Example 14, the four photovoltaic elements 1201 were connected in series, and a bypass diode was connected in parallel to each photovoltaic element 1201.

Next, stacked on a Galvalume sheet 1.0 mm thick were EVA, nylon resin, EVA, nonwoven glass fabric, the photovoltaic elements connected in series, nonwoven glass fabric, EVA, nonwoven glass fabric, EVA, nonwoven glass fabric, and fluororesin, and then they were heated to undergo vacuum sealing (lamination). The solar cell module thus produced was bent in the form suitable for the "batten seam roofing," which was an existing roof material installation method, to obtain a building material.

Then, the building material produced was installed.

First, the roof material incorporating the solar cell module thus produced (hereinafter called SC Ex 16-1) was fixed. Then, the terminals of the solar cell module fixed were electrically connected to terminals of other solar cell modules, so as to be able to extract the power generated.

Comparative Example 16-1

The solar cell module was produced in the same manner as in Example 16, except that the i-type layer 1108 was deposited in the thickness of 1.5 μm only under the conditions of the first i-type microcrystal semiconductor layer (μc-Si:H, the absorption coefficient of 300 cm$^{-1}$ at 800 nm). This solar cell module will be called SC Comp Ex 16-1.

During the installation there was a failure, and the damage appeared to be due to the load in SC Comp Ex 16-1, but there was no failure in SC Ex 16-1.

Generated power amounts were measured over one year after the installation and it was confirmed that SC Ex 16-1 was superior to SC Comp Ex 16-1. When the roof was visually observed, there was little delamination in SC Comp Ex 16-1, whereas there was no anomaly in SC Ex 16-1.

EXAMPLE 17

The output terminals of the solar cell module SC Ex 16-1 installed in Example 16 were connected to the power conversion means to form a power generation system. The power conversion means was connected to an inverter and an interconnection protecting device, and was further connected to the commercial power system by the interconnection protecting device. The interconnection protecting device functions to interrupt the connection between the solar power generation system and the commercial power system in case of an anomaly, such as overcurrent or the like.

Comparative Example 17-1

The power generation system was formed in the same manner as in Example 17, except that SC Comp Ex 16-1 was used as the solar cell module.

Errors in the system were tracked over one year after the installation and the results showed that the system error occurred twice in SC Comp Ex 17-1, but there were no error in SC Ex 17-1.

EXAMPLE 18

A photodiode was produced in the structure of FIG. 2 by using the stainless steel substrate (SUS 304) having the thickness of 0.2 mm and the size of 50 mm×50 mm as the substrate 201, depositing the back reflecting layer (Al, 200 nm) 209 and the transparent conductive layer (ZnO, 0.5 $\mu$m) 202 in the same manner as in Example 3, using the deposition apparatus shown in FIG. 4, and depositing the photoelectric conversion layers under the conditions of Table 38 using the deposition apparatus shown in FIG. 5.

In this example, the first conduction type semiconductor layer 203 deposited was an n-type semiconductor layer ($\mu$c-Si:H, 20 nm).

The i-type layer 208 was 50 units 207 successively stacked, each unit 207 being a set of the first i-type microcrystal semiconductor layer ($\mu$c-SiGe:H, the absorption coefficient of 1500 $cm^{-1}$ at 800 nm, the thickness of 10 nm) 204 and the second i-type microcrystal semiconductor layer ($\mu$c-Si:H, the absorption coefficient of 500 $cm^{-1}$ at 800 nm, the thickness of 10 nm) 205.

Further, the second conduction type semiconductor layer 206 deposited was a p-type semiconductor layer ($\mu$c-Si:H, 20 nm). After that, the transparent electrode 210 and collector electrode 211 were deposited in the same manner as in Example 3. This photodiode will be called PD Ex. 18-1.

TABLE 38

| p-type layer (second conduction type semiconductor layer 206) | |
|---|---|
| $SiH_4$ | 2 sccm |
| $H_2$ | 300 sccm |
| $BF_3/H_2$ | 15 sccm |
| pressure | 1 Torr |
| substrate temperature | 200° C. |
| RF power | 50 W |
| i-type layer 208 | |
| first i-type $\mu$c semiconductor layer 204 | |
| $SiH_4$ (source gas) | 50 sccm |
| $H_2$ (dilution gas) | 800 sccm |
| deposition time | 1000 sec |
| pressure | 40 mTorr |
| substrate temperature | 240° C. |
| MW power | 20 W |
| second i-type $\mu$c semiconductor layer 205 | |
| $SiH_4$ (source gas) | 40 sccm |
| $GeF_4$ (source gas) | 10 sccm |
| $H_2$ (dilution gas) | 1200 sccm |
| deposition time | 100 sec |
| pressure | 50 mTorr |
| substrate temperature | 240° C. |
| MW power | 20 W |
| n-type layer (first conduction type semiconductor layer 203) | |
| $SiH_4$ | 3 sccm |
| $H_2$ | 400 sccm |
| $PF_5/H_2$ | 10 sccm |
| pressure | 1 Torr |
| substrate temperature | 300° C. |
| RF power | 50 W |

Comparative Example 18-1

The photodiode was produced in the same manner as in Example 18, except that the i-type layer 208 was deposited with the thickness of 1 $\mu$m only under the conditions of the first i-type microcrystal semiconductor layer ($\mu$c-SiGe:H, the absorption coefficient of 1500 $cm^{-1}$ at 800 nm). This photodiode will be called PD Comp Ex 18-1.

Comparative Example 18-2

The photodiode was produced in the same manner as in Example 18, except that the i-type layer 208 was deposited with the thickness of 1 $\mu$m only under the conditions of the second i-type microcrystal semiconductor layer ($\mu$c-Si:H, the absorption coefficient of 500 $cm^{-1}$ at 800 nm). This photodiode will be called PD Comp Ex 18-2.

With the photodiodes PD Ex 18-1, PD Comp Ex 18-1, and PD Comp Ex 18-2, an on/off ratio (photocurrent under illumination of 20 mW/$cm^2$ monochromatic light of 800 nm/dark current was measured at the measurement frequency 20 kHz). This will be called an initial on/off ratio. Then the following tests were conducted. (Table 39 shows the results of the tests.).

The light degradation test was carried out as follows. The photodiode, after the measurement of the initial on/off ratio, was first set under the circumstance of 50% humidity and a temperature of 25° C. and was exposed to the illumination of 20 mW/$cm^2$ monochromatic light with a wavelength of 800 nm for 500 hours. The photodiode was evaluated based on a rate of the on/off ratio under the 20 mW/$cm^2$ monochromatic light of 800 nm after the 500-hour exposure to the initial on/off ratio (the on/off ratio after the light degradation test/the initial on/off ratio).

The vibration degradation test was carried out as follows. The photodiode, after the measurement of the initial on/off ratio, was placed in a dark space under the humidity 50% and the temperature 25° C. and was subjected to the vibration at the vibration frequency 60 Hz and the amplitude 0.1 mm for 500 hours. The photodiode was evaluated based on a rate of the on/off ratio under the 20 mW/$cm^2$ monochromatic light of 800 nm after the 500-hour vibration to the initial on/off ratio (the on/off ratio after the vibration degradation test/the initial on/off ratio).

TABLE 39

| Sample No. | Initial on/off ratio | After optical degradation | After vibration degradation | Overall rank |
|---|---|---|---|---|
| PD Ex 18-1 | 1.00 | 1.00 | 1.00 | ○ |
| PD Comp Ex 18-1 | 0.95 | 0.82 | 0.91 | x |
| PD Comp Ex 18-2 | 0.93 | 0.87 | 0.87 | x |

It was verified from the above results that PD Ex 18-1 was superior to the comparative examples.

As described above, the photovoltaic element of the present invention can absorb light efficiently with avoiding the optical degradation phenomenon (Staebler-Wronski effect) specific to the amorphous semiconductors and is improved in the electric characteristics (mobility $\mu$, lifetime $\tau$) and the like. Particularly, the deposition time and raw materials can be decreased by decreasing the thickness of the semiconductor layers. The photovoltaic element of the present invention is excellent in design and installation performance, because it can be bent, though having the high efficiency, unlike the crystal base photovoltaic elements which cannot be bent.

The solar cell module of the present invention has the improved reliability in the weather resistance, endurance, etc., while demonstrating the improved photovoltaic efficiency, and thus is suitably applicable to line sensors for inputting images of semiconductor devices, solar cells, photodiodes, and so on.

What is claimed is:

1. A photovoltaic element comprising a first conduction type semiconductor layer of the n-type or the p-type, an intrinsic semiconductor layer, and a second conduction type semiconductor layer of the p-type or the n-type successively stacked on a substrate, wherein when one unit is a set of a first microcrystal silicon base semiconductor layer and a second microcrystal silicon base semiconductor layer of mutually different absorption coefficients at 800 nm, the intrinsic semiconductor layer comprises at least two said units.

2. The photovoltaic element according to claim 1, wherein the first microcrystal silicon base semiconductor layer and the second microcrystal silicon base semiconductor layer are of columnar crystal structure.

3. The photovoltaic element according to claim 1, wherein an average grain size of the first microcrystal silicon base semiconductor layer is different from an average grain size of the second microcrystal silicon base semiconductor layer.

4. The photovoltaic element according to claim 3, wherein the average grain sizes of the first microcrystal silicon base semiconductor layer and the second microcrystal silicon base semiconductor layer are in a range of 3 nm to 200 nm.

5. The photovoltaic element according to claim 1, wherein a crystal volume percentage of the first microcrystal silicon base semiconductor layer is different from a crystal volume percentage of the second microcrystal silicon base semiconductor layer.

6. The photovoltaic element according to claim 5, wherein the crystal volume percentages of the first microcrystal silicon base semiconductor layer and the second microcrystal silicon base semiconductor layer are in a range of 30% to 99%.

7. The photovoltaic element according to claim 1, wherein a hydrogen content of the first microcrystal silicon base semiconductor layer is different from a hydrogen content of the second microcrystal silicon base semiconductor layer.

8. The photovoltaic element according to claim 7, wherein the hydrogen contents of the first microcrystal silicon base semiconductor layer and the second microcrystal silicon base semiconductor layer are in a range of 1 atom % to 40 atom %.

9. The photovoltaic element according to claim 1, wherein the first conduction type semiconductor layer comprises at least one layer of a microcrystal silicon base semiconductor.

10. The photovoltaic element according to claim 1, wherein the second conduction type semiconductor layer comprises at least one layer of a microcrystal silicon base semiconductor.

11. The photovoltaic element according to claim 1, wherein the first conduction type semiconductor layer is a stack of an amorphous silicon base semiconductor layer and at least one layer of a microcrystal silicon base semiconductor.

12. The photovoltaic element according to claim 1, wherein the second conduction type semiconductor layer is a stack of an amorphous silicon base semiconductor layer and at least one layer of a microcrystal silicon base semiconductor.

13. The photovoltaic element according to claim 1, further comprising an amorphous silicon base intrinsic semiconductor layer between the intrinsic layer and the p-type layer.

14. The photovoltaic element according to claim 13, wherein a thickness of the amorphous silicon base semiconductor layer is in a range of 5 nm to 30 nm.

15. The photovoltaic element according to claim 13, wherein a thickness of the amorphous silicon base semiconductor layer is in a range of 10 nm to 20 nm.

16. A photovoltaic element comprising the photovoltaic element of any one of claims 1 to 15, and a pin type photovoltaic element having an amorphous silicon base semiconductor as an intrinsic semiconductor layer.

17. A solar cell module wherein the photovoltaic element of any one of claims 1 to 15 is formed as a roof material.

18. A solar cell module wherein the photovoltaic element of any one of claims 1 to 15 is connected to power conversion means.

* * * * *

UNITED STATES PATENT AND TRADEMARK OFFICE
CERTIFICATE OF CORRECTION

PATENT NO. : 6,252,158 B1
DATED : June 26, 2001
INVENTOR(S) : Makoto Higashikawa It is certified that error appears in the above-identified patent and that said Letters Patent is hereby corrected as shown below:

Column 1,
Line 23, "like" should read -- like, --;
Line 27, "commonly" should read -- common --;
Line 44, "that it is" (both occurrences) should be deleted;
Line 46, "development" should read -- develop --;
Line 49, "materials and," should be deleted; "materials," should read -- materials and --; and
Line 57, "group" should read -- group, --.

Column 2,
Line 5, "23th" should read -- 23rd --;
Line 17, "Å.¶ Further," should read -- Å. Furthermore, --;
Line 22, "23th" should read -- 23rd --;
Line 32, "23th" should read -- 23rd --; and
Line 36, "the deposition of" should read -- depositing --.

Column 4,
Line 58, "FIG. 3 shows the light energy dependence of absorption" should be deleted;
Line 59, "coefficient." should be deleted.

Column 5,
Line 22, "of" should be deleted; and
Line 62, "electron" should read -- electrons --.

Column 6,
Line 7, "appears" should read -- appear --;
Line 40, "observed degradation," should read -- degradation observed --;
Line 51, "semiconductor." should read -- semiconductor layer. --;
Line 66, " the electric conductivity is attempted to" should read -- an attempt is made to increase electric conductivity --; and
Line 67, "increase" should be deleted.

Column 7,
Line 15, "layer" should read -- layer, --.

Column 8,
Line 16, "2" should read -- 2 shows --;
Line 54, "alloy" should read -- alloy, --; and
Line 59, "conductive" should read -- conductive, --.

UNITED STATES PATENT AND TRADEMARK OFFICE
CERTIFICATE OF CORRECTION

PATENT NO. : 6,252,158 B1
DATED : June 26, 2001
INVENTOR(S) : Makoto Higashikawa It is certified that error appears in the above-identified patent and that said Letters Patent is hereby corrected as shown below:

Column 9,
Line 19, "decrease" should read -- decreased --; and
Line 46, "as" should be deleted.

Column 10,
Line 10, " silicon." should read -- silicon. Among --;
Line 11, "¶Among" should read -- Among --;
Line 26, "film" should read -- film, --; and
Line 40, "on;" should read -- on; or --.

Column 11,
Line 46, "erably" should read -- erably about --.

Column 12,
Line 53, "and" should read -- and, --;
Line 55, "and" should read -- and, --; and
Line 58, "and" should read -- and, --.

Column 14,
Line 7, "$B_6H_{10}$," should read -- $B_6H_{10}$, --;
Line 39, "that," should read -- that --; and
Line 48, "etc." should read -- etc., --.

Column 15,
Line 33, "resistance" should read -- resistant --.

Column 16,
Line 44, "and" should be deleted;
Line 53, "with" should read -- while --; and
Line 58, "those" should be deleted.

Column 18,
Line 51, "Then" should read -- Then, --;
Line 59, "Table 1" should read -- Table 1, --; and
Line 66, "the inside of" should be deleted.

Column 19,
Line 21, "the inside of" should be deleted.

Column 29,
Table 12, "096" should read -- 0.96 --.

UNITED STATES PATENT AND TRADEMARK OFFICE
CERTIFICATE OF CORRECTION

PATENT NO.   : 6,252,158 B1
DATED        : June 26, 2001
INVENTOR(S)  : Makoto Higashikawa It is certified that error appears in the above-identified patent and that said Letters Patent is hereby corrected as shown below:

Column 32,
Line 54, "each" should read -- each being --.

Column 50,
Line 44, "failure," should read -- failure in SC Comp Ex 16-1, --; and
Line 45, "in SC Comp Ex 16-1" should be deleted.

Column 51,
Line 3, "error" should read -- errors --.

Column 52,
Line 17, "Then" should read -- Then, --.
Line 55, "with" should read -- while --.

Signed and Sealed this

Twenty-third Day of April, 2002

*Attest:*

*Attesting Officer*

JAMES E. ROGAN
*Director of the United States Patent and Trademark Office*